US008890110B2

United States Patent
Park

(10) Patent No.: US 8,890,110 B2
(45) Date of Patent: Nov. 18, 2014

(54) VERTICAL MEMORY DEVICE AND METHOD OF FABRICATING THE SAME

(71) Applicant: SK Hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/845,959

(22) Filed: Mar. 18, 2013

(65) Prior Publication Data

US 2013/0334488 A1 Dec. 19, 2013

(30) Foreign Application Priority Data

Jun. 19, 2012 (KR) .................. 10-2012-0065803
Jun. 19, 2012 (KR) .................. 10-2012-0065804

(51) Int. Cl.
*H01L 47/00* (2006.01)
*H01L 21/336* (2006.01)
*H01L 27/24* (2006.01)
*H01L 45/00* (2006.01)

(52) U.S. Cl.
CPC ......... *H01L 27/2454* (2013.01); *H01L 45/1683* (2013.01); *H01L 45/06* (2013.01); *H01L 27/2463* (2013.01); *H01L 45/126* (2013.01); *H01L 45/1233* (2013.01); *H01L 45/1608* (2013.01)
USPC ............................. 257/4; 257/328; 438/270

(58) Field of Classification Search
CPC ................. H01L 29/66734; H01L 29/7813; H01L 29/7827; H01L 29/66666
USPC ......................................... 438/3, 270
See application file for complete search history.

(56) References Cited

U.S. PATENT DOCUMENTS

| 8,206,995 B2* | 6/2012 | Reyes et al. ................. 438/3 |
| 8,207,032 B2* | 6/2012 | Fischer et al. .............. 438/242 |
| 8,450,175 B2* | 5/2013 | Guha et al. ................ 438/259 |
| 8,551,850 B2* | 10/2013 | Li et al. ................... 438/381 |
| 8,575,584 B2* | 11/2013 | Satoh et al. ................. 257/2 |
| 2008/0112211 A1* | 5/2008 | Toda .......................... 365/148 |
| 2011/0068418 A1* | 3/2011 | Lung ......................... 257/413 |

FOREIGN PATENT DOCUMENTS

| KR | 1020110032252 | 3/2011 |
| KR | 1020110106682 | 9/2011 |

* cited by examiner

*Primary Examiner* — William D Coleman
(74) *Attorney, Agent, or Firm* — IP & T Group LLP

(57) ABSTRACT

A vertical memory device capable of minimizing a cell size and improving current drivability and a method of fabricating the same are provided. The vertical memory device includes a common source region and source regions formed on the common source region and extending in a first direction. Channel regions are formed on each of the source regions, the channel regions extending in the first direction. Trenches are formed between the channel regions. A drain region is formed on each of the channel regions. A conductive layer is formed on a side of each of the channel regions, the conductive layer extending to the first direction. A data storage material is formed on each of the drain regions.

58 Claims, 28 Drawing Sheets

(a)　　　　　　　　　　(b)

(a) (b)

(a) (b)

VERTICAL MEMORY DEVICE AND METHOD OF FABRICATING THE SAME

CROSS-REFERENCES TO RELATED APPLICATION

This application claims priority under 35 U.S.C. 119(a) to Korean application numbers 10-2012-0065803 and 10-2012-0065804, filed on Jun. 19, 2012, in the Korean Patent Office, which is incorporated by reference in its entirety.

BACKGROUND OF THE INVENTION

1. Technical Field

The inventive concept relates to a semiconductor device, and more particularly, to a vertical memory device and a method of fabricating the same.

2. Related Art

The distribution rate of portable dig devices has been increasing day by day and ultra-high integration, ultra-high speed, and ultra-low power of memory devices, which are built in a limited size to process large capacity of data with high speed, have been required.

Studies on vertical memory devices have been actively progressed to meet these demands. Recently, the vertical structures are introduced into resistive memory devices that are spotlighted as next-generation memory devices.

The resistive memory devices are devices that select a memory cell through an access element, change a resistance state of a data storage material electrically connected to the access element, and store data. There are typically phase-change random access memories (PRAMs), resistance RAMs (ReRAMs), magnetoresistive RAMs (MRAMs), and the like as the resistive memory devices.

Diodes or transistors may be employed as the access element of the resistive memory devices. In particular, the threshold voltage of the transistors is controlled to be low as compared with the diodes and thus the operation voltage thereof can be reduced, and the transistors have received attention again as the access element of the resistive memory devices by applying the vertical structure thereto.

That is, since the voltage of 1.1 V or more has to be applied to the diodes, there is a limitation to reduce an operation voltage of the diodes. Further, when the diodes are formed on a word line, a resistance of the word line is varied according to positions of the cells to cause word line to be bounced.

Since transistors in the related art are formed in a horizontal structure, the reduction rate is restricted. However, the vertical transistors can sufficiently ensure current drivability in the limited channel area.

SUMMARY

An exemplary vertical memory device may include a common source region; source regions formed on the common source region and extending in a first direction; channel regions formed on each of the source regions, the channel regions extending in the first direction; trenches formed between the channel regions; a drain region formed on each of the channel regions; a conductive layer formed on a side of each of the channel regions, the conductive layer extending to the first direction; and a data storage material formed on each of the drain regions.

A method of fabricating a vertical memory device may include sequentially forming, on a semiconductor substrate, a first junction region, a channel region, and a second junction region; line-patterning the second junction region, the channel region, and a portion of the first junction region to a first direction to form a line-patterned structure; forming spacers, made of first insulating layers, and conductive layers on outer sidewalls of the line-patterned structure; forming second insulating layers on the semiconductor substrate, including the spacers and the conductive layers, and planarizing the second insulating layers to expose the second junction region and the conductive layers; removing, to a predetermined depth, exposed portions of the conductive layers and forming third insulating layers in spaces from which the exposed portions of the conductive layers are removed; and patterning the second junction region and a portion of the channel region in a second direction perpendicular to the first direction.

A method of fabricating a vertical memory device may include sequentially forming a first junction region, a channel region, a second junction region, a heating material, and a sacrificial layer on a semiconductor substrate; line-patterning, in a first direction, the sacrificial layer, the heating material, the second junction region, the channel region, and a portion of the first junction region to form a line-patterned structure; forming spacers, made of first insulating layers, and conductive layers on outer sidewalls of the line-patterned structure; forming second insulating layers on the semiconductor substrate, including the spacers and the conductive layers, and planarizing the second insulating layers to expose the sacrificial layer and the conductive layers; removing, to a predetermined depth, the exposed portions of the conductive layers and forming third insulating layers in spaces from which the exposed portions of the conductive layers are removed; patterning, in a second direction perpendicular to the first direction, the sacrificial layer, the heating material, the second junction region, and a portion of the channel region; and forming a data storage material in a space from which the sacrificial layer is removed.

An exemplary vertical memory device may include a common source region; source regions formed on the common source region, the source regions extending in a first direction; channel regions formed on each of the source regions, the channel regions extending in the first direction; a conductive layer formed on each of the source regions in a space between each of the channel regions; a drain region formed on each of the conductive layers; and a data storage material formed on each of the drain regions.

An exemplary vertical memory device may include a common source region; source regions formed on the common source region and extending in a first direction; trenches formed between the source regions to a predetermined depth a channel region formed on each of the source regions and extending in the first direction; a conductive layer formed on each of the source regions in a space between the channel regions; a drain region formed on the conductive layer; and a data storage material formed on each of the drain regions.

A method of fabricating a vertical memory device may include sequentially forming, in a first direction, a first junction region, a channel region, and a hard mask line-patterned; line-patterning the channel region and a portion of first junction region to form a line-patterned structure; forming a first insulating layer on an outer sidewall of the line-patterned structure; removing the hard mask; forming a insulating layer spacer on an inner sidewall of the first insulating layer on the channel region; etching the exposed channel region and a portion of the first junction region to form a self-aligned trench; sequentially forming a gate insulating layer and a conductive layer in the self-aligned trench; recessing the conductive layer so that the conductive layer overlaps the channel region; and forming a second junction region and a data storage material on the conductive layer.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
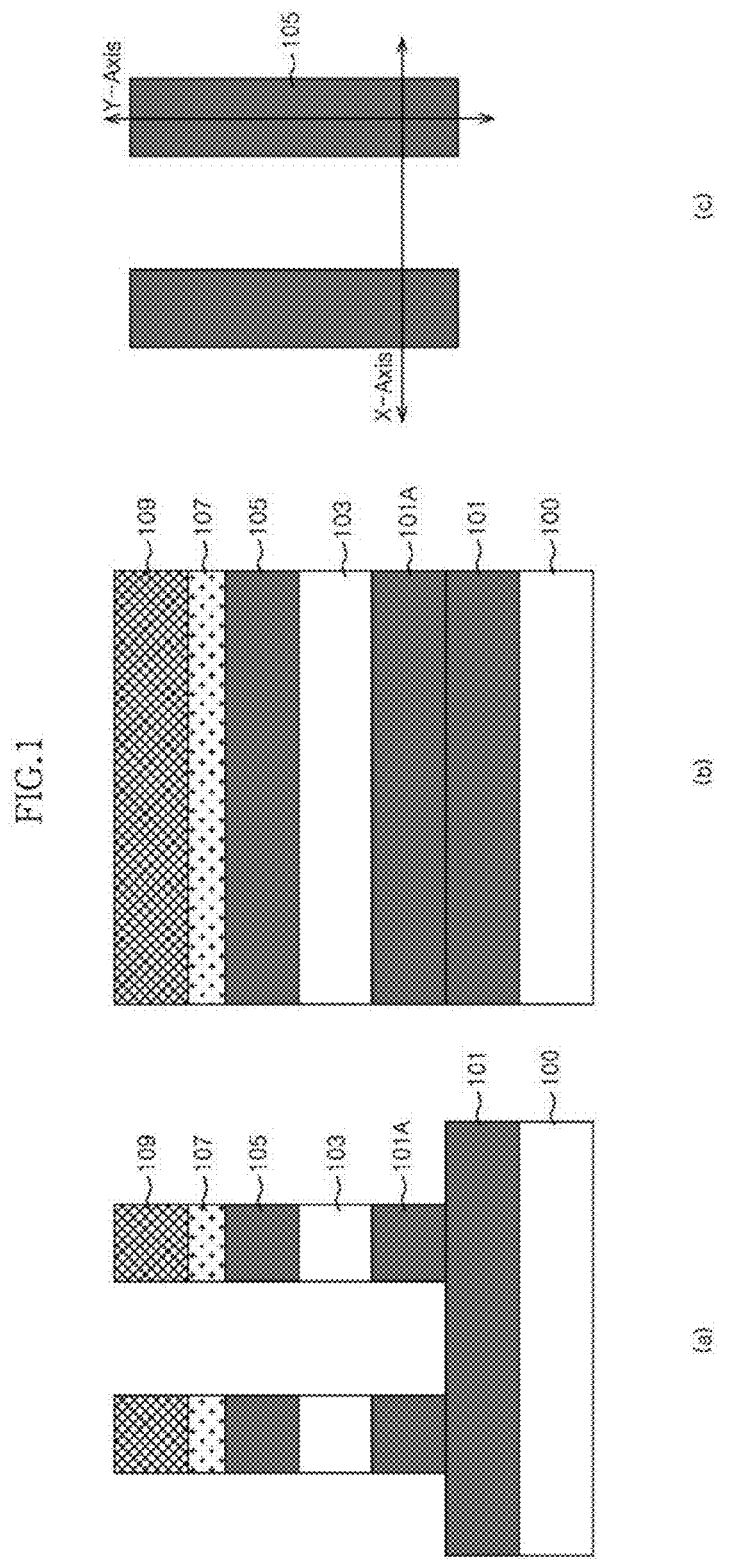
FIGS. 1 to 7 are views illustrating a method of fabricating an exemplary vertical memory device.

Hereinafter, exemplary implementations will be described in greater detail with reference to the accompanying drawings. In drawings, (a) is a cross-sectional view of a vertical memory device in a second direction (an X-direction), for example, a bit line direction, (b) is a cross-sectional view of the vertical memory device in a first direction (a Y-direction), for example, a word line direction, and (c) is a layout diagram.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 1 to 7 are views illustrating a method of fabricating an exemplary vertical memory device. channel region 103, a second junction region 105, a heating material 107, and a sacrificial layer 109 are sequentially formed on a semiconductor substrate 100. The sacrificial layer 109, the heating material 107, the second junction region 105, the channel region 103, and a portion of the first junction region 101 and 101A are line-patterned to the first direction to form a line-patterned structure.

The semiconductor substrate 100 may include a semiconductor material such as Si, silicon germanium (SiGe) or gallium arsenic (GaAs) and has a structure of a single layer thereof or a combination layer thereof.

In an exemplary implementation, when the line-patterned structure is formed, the first junction region 101 and 101A is removed to a predetermined depth to include a common source region 101 and a switching source region 101A. The second junction region 105 may be a drain region.

Further, an access element, such as a transistor, may be formed in an NMOS type, a PMOS type, or an impact-ionization (I-MOS) type according to a conductivity type of an impurity injected into the first junction region 101 and 101A, the channel region 103, and the second junction region 105. Specifically, the transistor may be formed in the NMOS type by considering a threshold voltage and the like.

When the NMOS type transistor is formed, N type ions may be implanted into the first junction region 101 and 101A and the second junction region 105 and P type ions may be implanted into the channel region 103. When the PMOS type transistor is formed, P type ions may be implanted into the first junction region 101 and 101A and the second junction region 105 and N type ions may be implanted into the channel region 103.

When the I-MOS type transistor is formed, N+ type ions may be implanted into the first junction region 101 and 101A, P+ type ions may be implanted into the second junction region 105, and P– type ions, N– type ions, or a combination thereof may be implanted into the channel region 103. Alternatively, P+ type ions may be implanted into the first junction region 101 and 101A, N+ type ions may be implanted into the second junction region 105, and P– type ions, N– type ions, or a combination thereof may be implanted into the channel region 103.

The sacrificial layer 109 may be formed of a hard mask and removed in a subsequent process and a data storage material, for example, a variable resistive material may be formed in a space from which the sacrificial layer is removed.

The heating material 107 may be formed using metal, an alloy, metal oxynitride, or a conductive carbon compound. For example, the heating material 107 may be formed of tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), or tantalum oxynitride (TaON). However, the heating material is not limited thereto.

Although not shown, a silicide layer may be further formed on the heating material 107 and the heating material 107 may be formed of two or more conductive layers.

The silicide layer may be formed, for example, of Ti, cobalt (Co), nickel (Ni), W, platinum (Pt), lead (Pb), Mo, or Ta, but the silicide layer is not limited thereto.

FIG. 1(c) shows a layout diagram of the second junction region 105.

Figure 2:
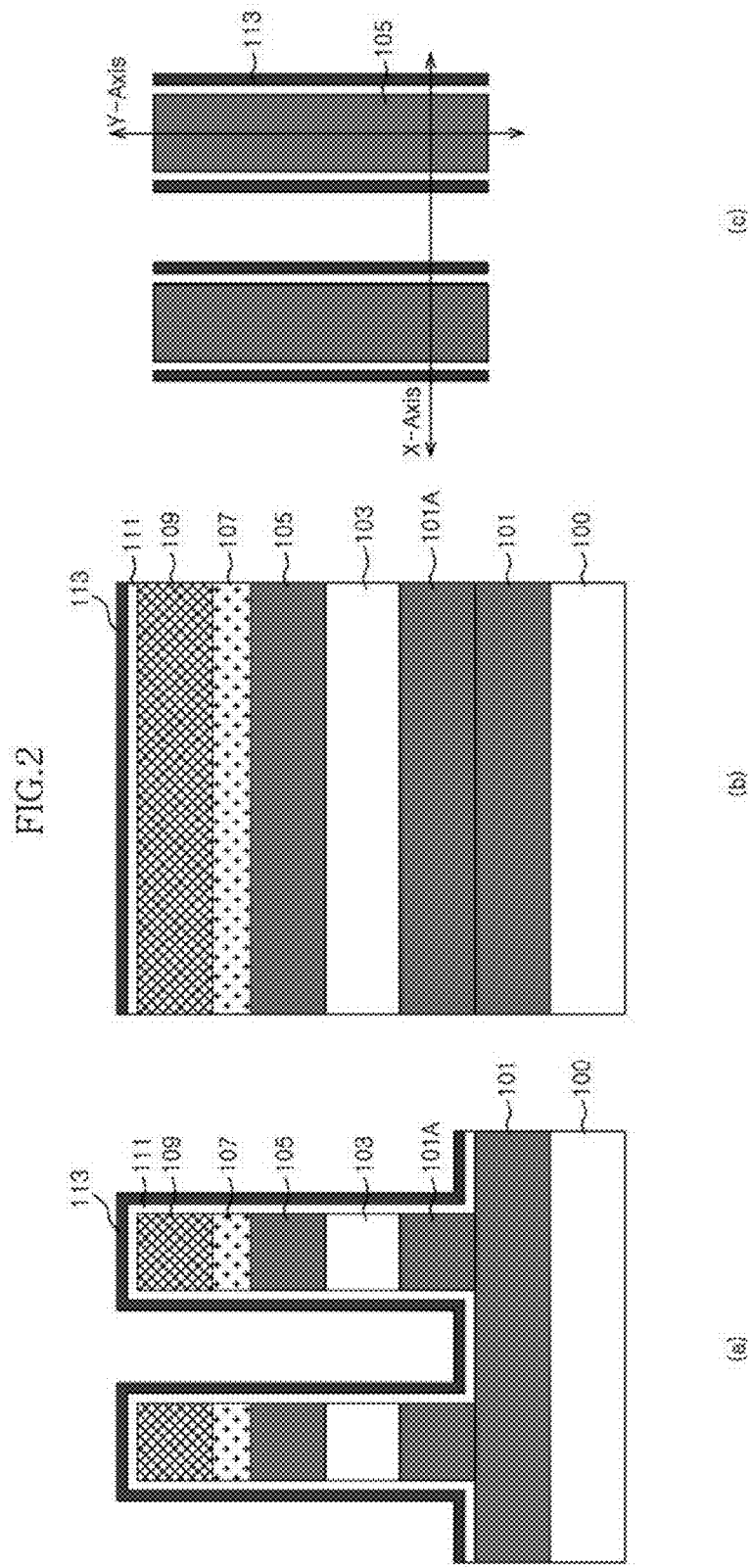

Referring to FIG. 2, a gate insulating layer 111 and a conductive layer 113 are formed on the semiconductor substrate in which the line-patterned structure is formed. The conductive layer 113 serves as a gate electrode, that is, a word line.

In the exemplary implementation, the gate insulating layer 111 may be formed of a single layer including an oxide or a nitride of silicon (Si), Ta, Ti, barium titanium (BaTi), barium zirconium (BaZr), zirconium (Zr), hafnium (Hf), lanthanum (La), aluminum (Al), yttrium (Y), zirconium silicide (ZrSi) or a combination layer thereof.

The conductive layer 113 may be formed of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TIW, TiON, TiAlON, WON, or TaON, but the conductive layer is not limited thereto.

As illustrated in FIG. 2(c), the conductive layer 113 is formed at both sides of the second junction region 105 as a gate electrode material.

Figure 3:
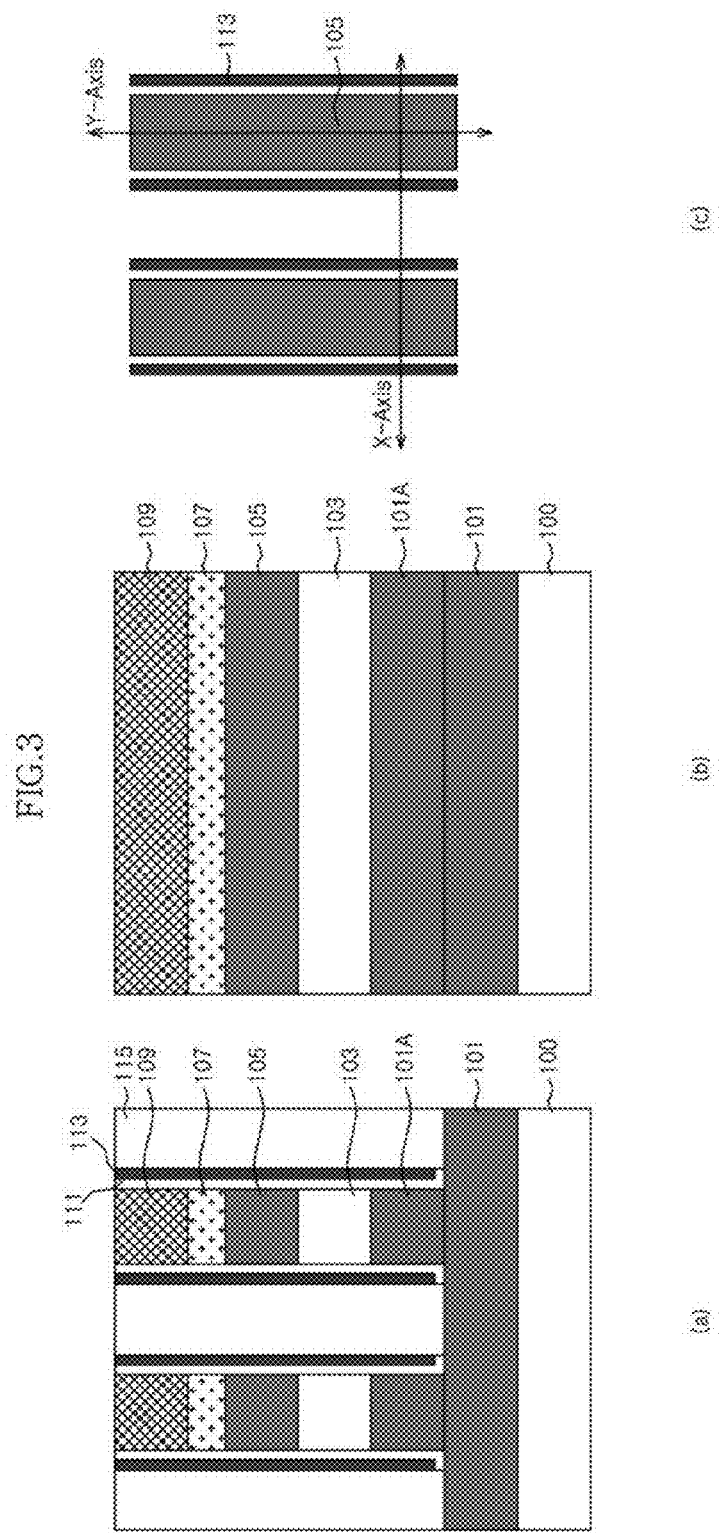

Referring to FIG. 3, the gate insulating layer 111 and the conductive layer 113 remain only on both sidewalls of the line-patterned structure through a spacer etching process. A second insulating layer 115 is formed on the semiconductor substrate including the gate insulating layer 111 and the conductive layer 113 and then planarized to expose upper surfaces of the sacrificial layer 109 and the conductive layer 113.

Figure 4:
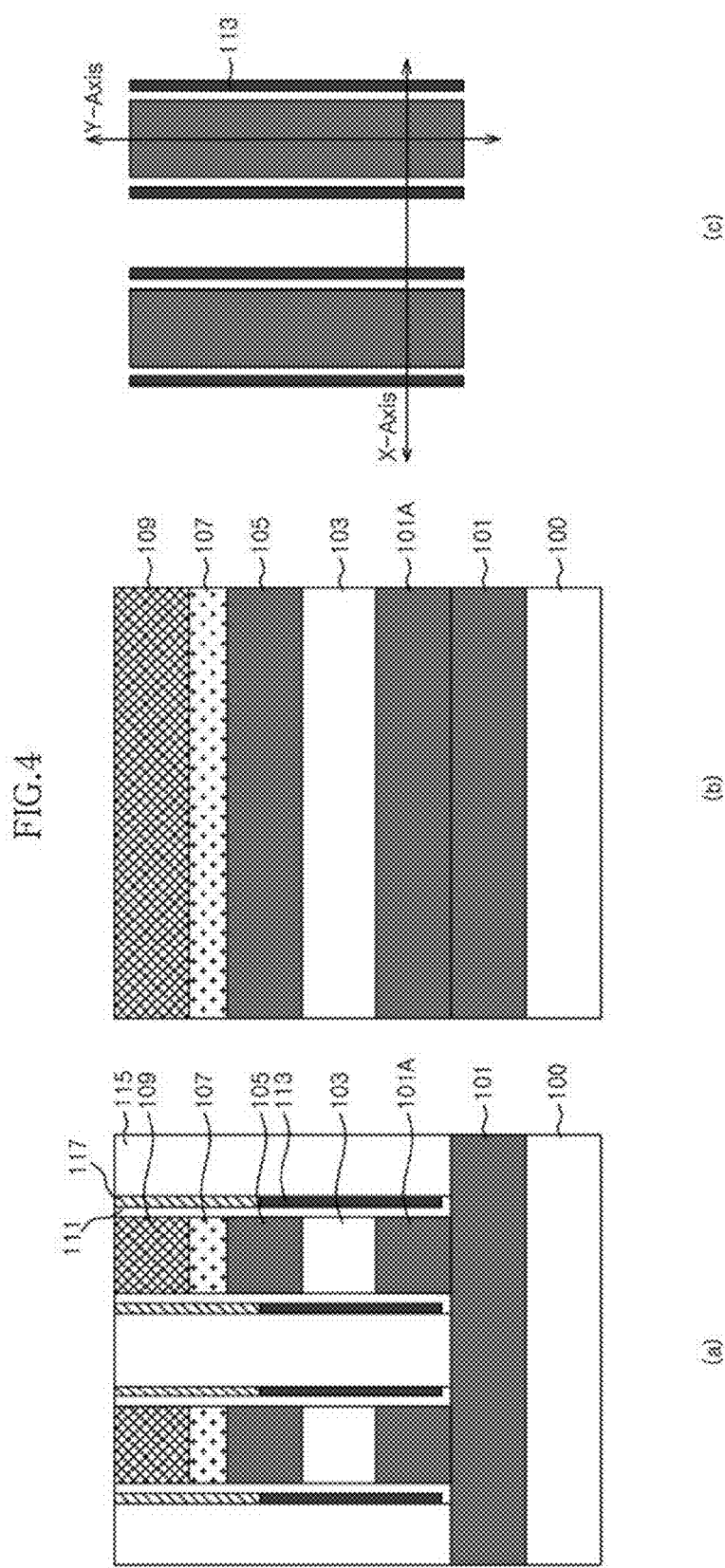

FIG. 4 illustrates a state n which the exposed conductive layer 113 is recessed to a predetermined depth, preferably, to a depth higher than or equal to a height of the channel region 103 and a third insulating layer 117 is buried in a recessed portion of the conductive layer.

When the conductive layer 113 is recessed a height of the conductive layer 113 is controlled so that the conductive layer 113 entirely overlap the channel region 103 and therefore the first junction region 101 and 101A, the channel region 103, the second junction region 105, and the conductive layer 113 are operated as the vertical transistor.

Figure 5:
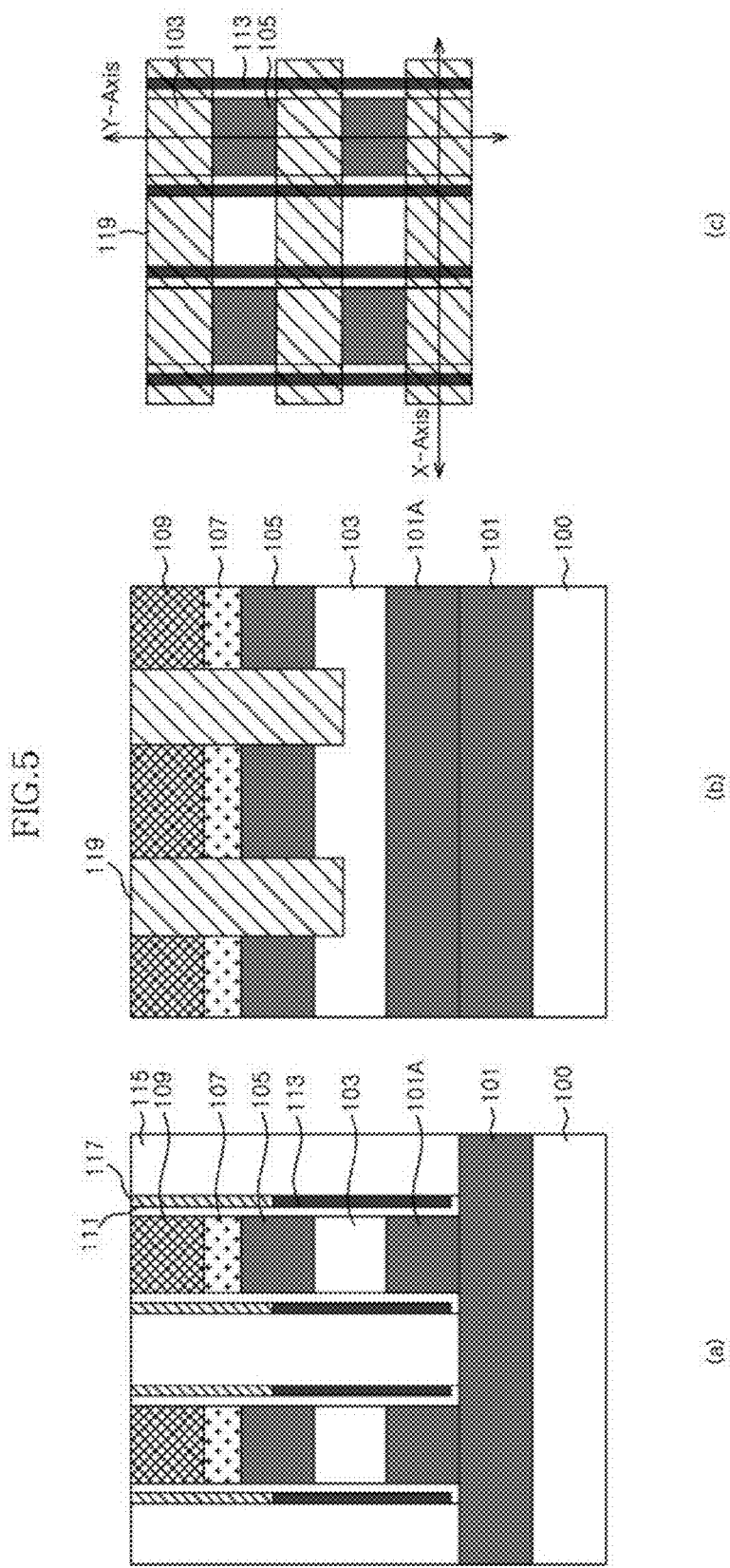

Referring to FIG. 5, the sacrificial layer 109, the heating material 107, the second junction region 105, and a portion of the channel region 103 are patterned to the second direction to achieve insulation between cells in the first direction. Then, a fourth insulating layer 119 is formed on the semiconductor substrate in which the insulation between the cells is achieved in the first direction and then planarized to expose an upper surface of the sacrificial layer 109.

Since the channel region 103 is not entirely patterned but partially etched to a predetermined depth, cells sharing the same word line can also share the channel region 103. Therefore, adjacent cells may be electrically short-circuited when a word line is disabled and a channel resistance is reduced in a state in which a specific transistor connected to a specific word line is turned on and thus current drivability can be improved.

Figure 6:
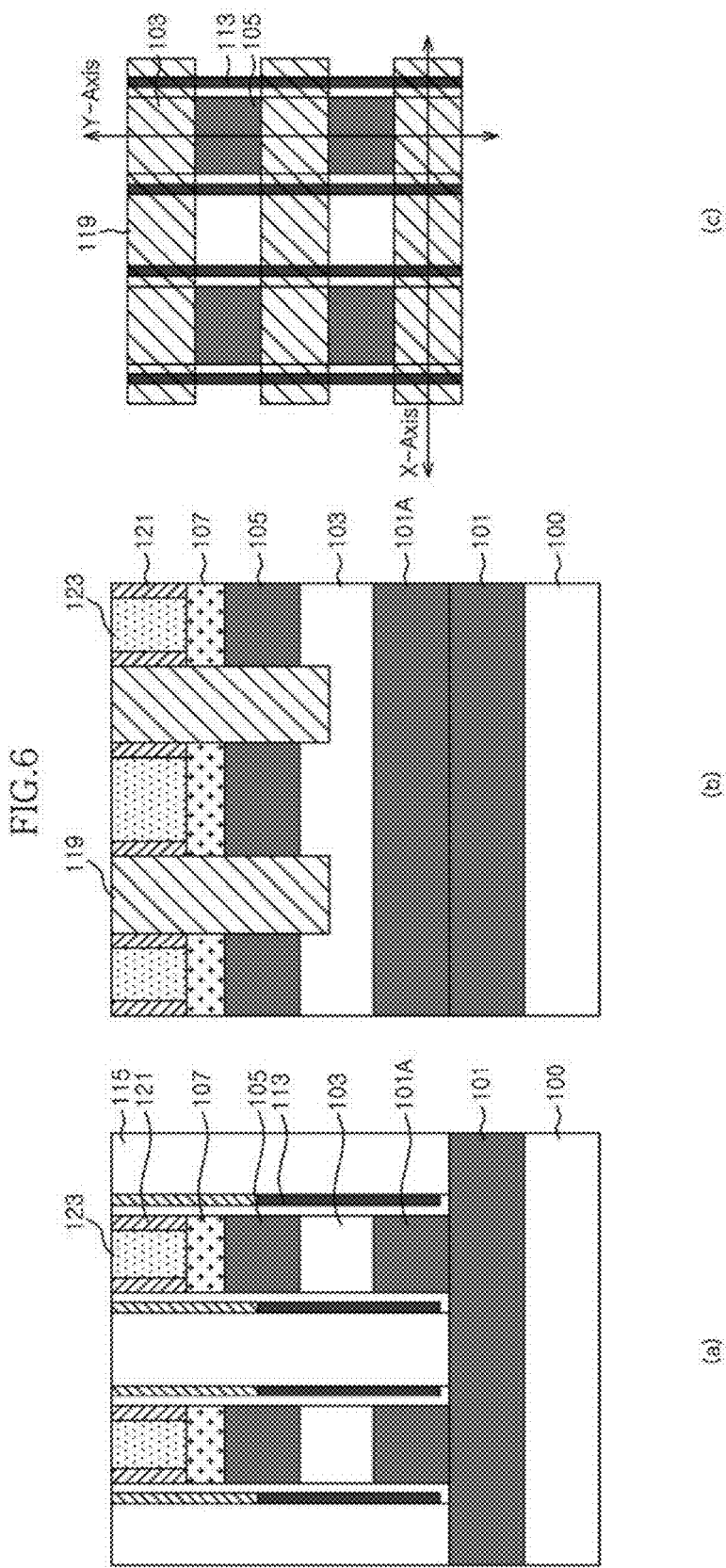

FIG. 6 illustrates a state n which the sacrificial layer 109 is removed and then a data storage material 123 is formed in a space from which the sacrificial layer 109 is removed.

In the exemplary implementation, after the sacrificial layer 109 is removed, a spacer 121 may be formed on an inner sidewall of the space from which the sacrificial layer is removed, and the data storage material 123 may be buried in the space.

The data storage material 123 may include a material for a PCRAM, a material for a ReRAM a material for a MRAM, a material for a spin-transfer torque magnetoresistive RAM (STTMRAM) or a material for a polymer RAM (PoRAM). For example, if the vertical memory device is a PCRAM then the data storage material may be formed, for example, of tellurium (Te), selenium (Se), germanium (Ge), antimony (Sb), bismuth (Bi), lead (Pb), tin (Sn), arsenic (As), sulfur (S), silicon (Si), phosphorus (P), oxygen (O), nitrogen (N), a compound thereof, or an alloy thereof.

Figure 7:
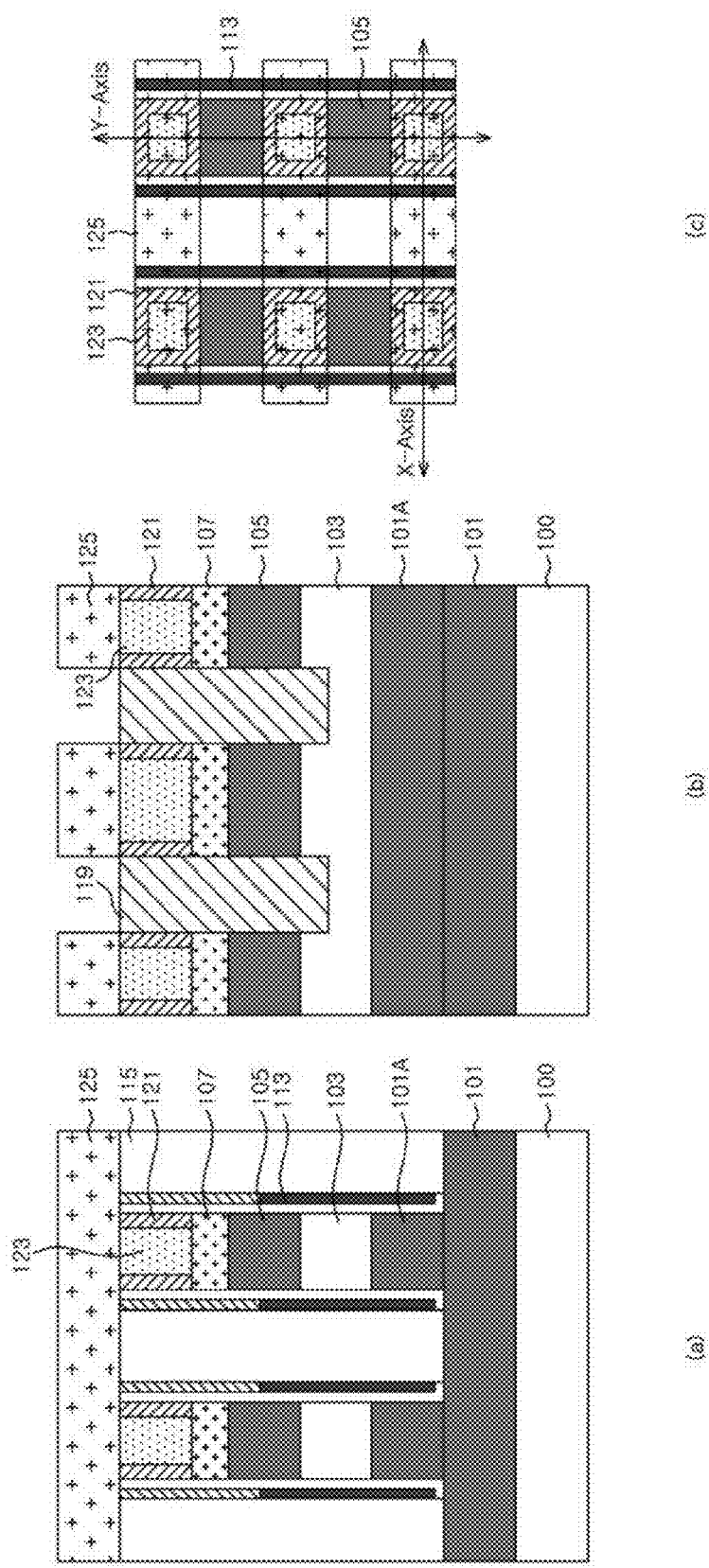

Referring to FIG. 7, a bit line 125 is formed on the data storage material 123.

Figure 8:
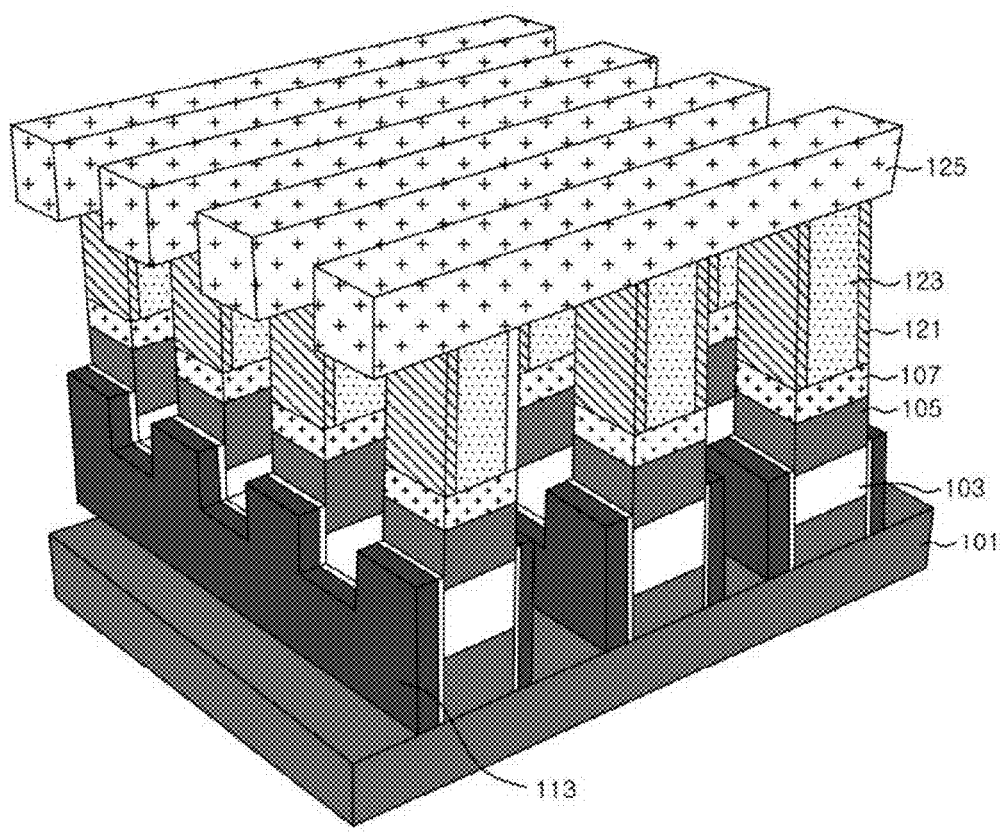
FIGS. 8 to 11 are views illustrating structures of the exemplary vertical memory device illustrated in FIG. 7.
Figure 9:
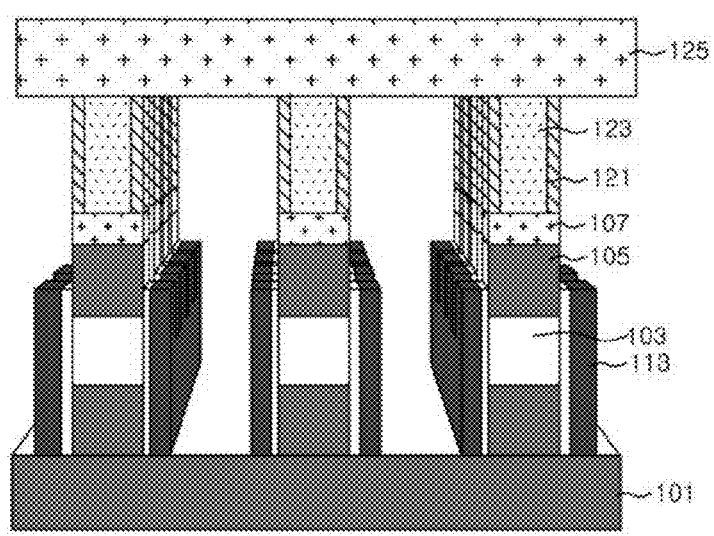
Figure 10:
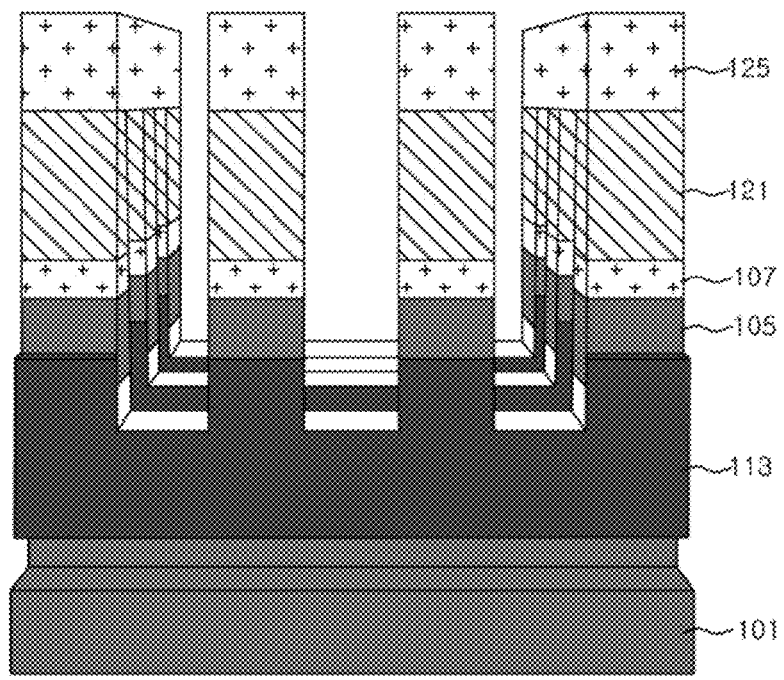
Figure 11:
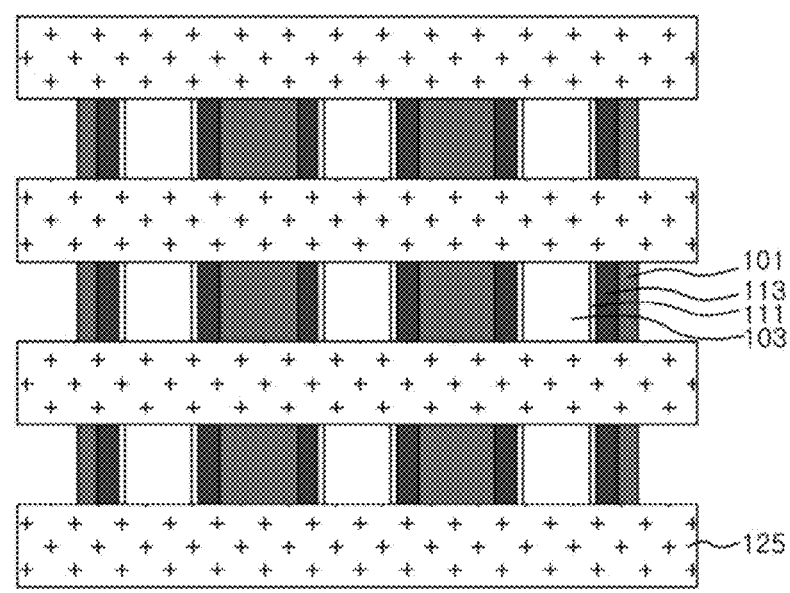

FIGS. 8 to 11 are views illustrating a structure of the exemplary vertical memory device illustrated in FIG. 7, wherein FIG. 8 is a perspective view, FIG. 9 is a front perspective view, FIG. 10 is a side perspective view, and FIG. 11 is a plan view.

As illustrated in FIGS. 8 to 11, all memory cells share the first junction region 101 and 101A, that is, a source region. Further, memory cells connected to the same word line 113 share the channel region 103.

Therefore, when the word line 113 and the bit line 125 are selected according to an address received from the outside to turn on a specific transistor, a resistance component formed through drain-channel-source can be reduced to ensure a reliable operation with low current drivability.

At this time, non-selected bit lines are controlled to be in a floating state to prevent current leakage through the non-selected bit lines.

Figure 12:
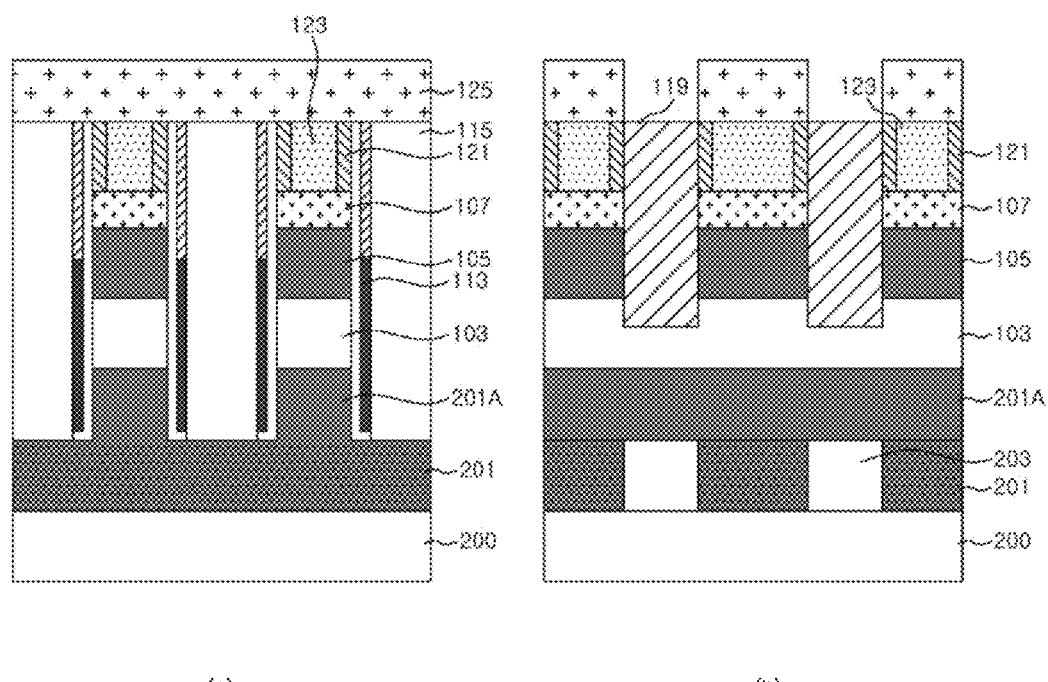
FIG. 12 is a cross-sectional view illustrating an exemplary vertical memory device.

FIG. 12 is a cross-sectional view illustrating an exemplary vertical memory device including a common junction region 201 and a switching junction region 201A, which constitute the first junction region 201 and 201A, are formed of different materials.

Further, the common junction region 201 may be line-patterned to the bit line direction perpendicular to the word line direction that is the first direction. An insulating layer 203 may be further formed between the line-type common junction regions 201.

Figure 13:
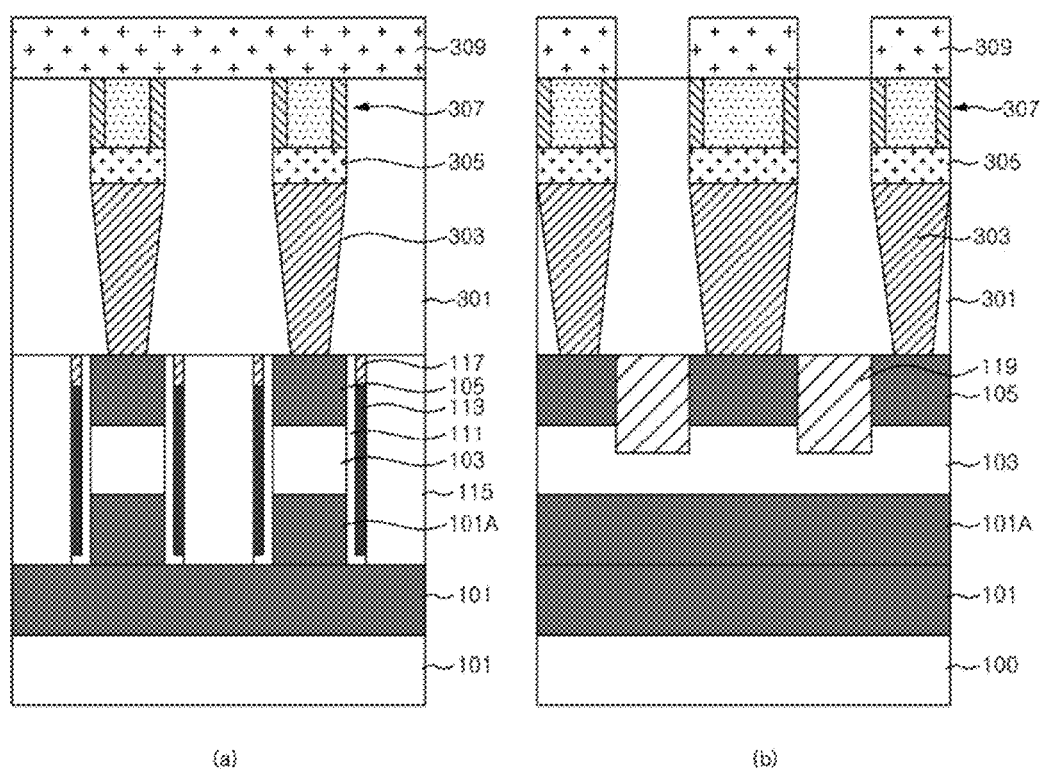
FIG. 13 is a cross-sectional view illustrating an exemplary vertical memory device.

FIG. 13 is a cross-sectional view illustrating an exemplary vertical memory device.

As illustrated in FIG. 13, a first junction region 101 and 101A, a channel region 103, and the second junction region 105 are sequentially formed on a semiconductor substrate 100 and then line-patterned to the first direction (the word line direction) to form a line-patterned structure.

Subsequently, a first insulating layer 111 and a conductive layer 113 are formed on the semiconductor substrate including the line-patterned structure and a spacer etching process is performed so that the first insulating layer 111 and the conductive layer 113 remain only on both sidewalls of the line-patterned structure. Next, a second insulating layer 115 is formed on the semiconductor substrate including the remaining first insulating layer and conductive layer and then planarized to expose upper surfaces of the second junction region 105 and the conductive layer 113, The exposed conductive layer 1.13 is recessed to a predetermined depth, preferably, a depth at which the conductive layer 113 can overlap the channel region 103 and a third insulating layer 117 is buried in a recessed portion.

Next, the second junction region 105 and a portion of the channel region 103 are etched to the second direction (the bit line direction) and then a fourth insulating layer is buried in an etched portion.

The structure of the vertical memory device until the fourth insulating layer is formed is similar to that of the vertical memory device illustrated in FIG. 7.

After the vertical transistor sharing the source region 101 and 101A and the channel region 103 is formed through the above-described method, the vertical transistor and a data storage material is connected through a contact and this will be described in more detailed below.

Referring back to FIG. 13, an insulating layer 301 is formed on the semiconductor substrate including the fourth insulating layer 119 and then etched to form a contact hole having a predetermined diameter and exposing an upper surface of the second junction regions 105.

Subsequently, conductive material layers 303 and 305 having predetermined thickness and a data storage material 307 are buried in the contact hole and a bit line 309 is formed on the data storage material 307.

Here, the conductive material layers 303 and 305 may include a contact plug 303 and the heating material 305. Further, the data storage material 307 may be configured that a spacer is formed on an outer circumference of the data storage material 307.

The vertical memory devices having the above-described various structures have illustrated that the bit line has a line-patterned structure as an example, but the bit fine may be patterned in an island type. In this case, interference between cells can be suppressed.

Figure 14:
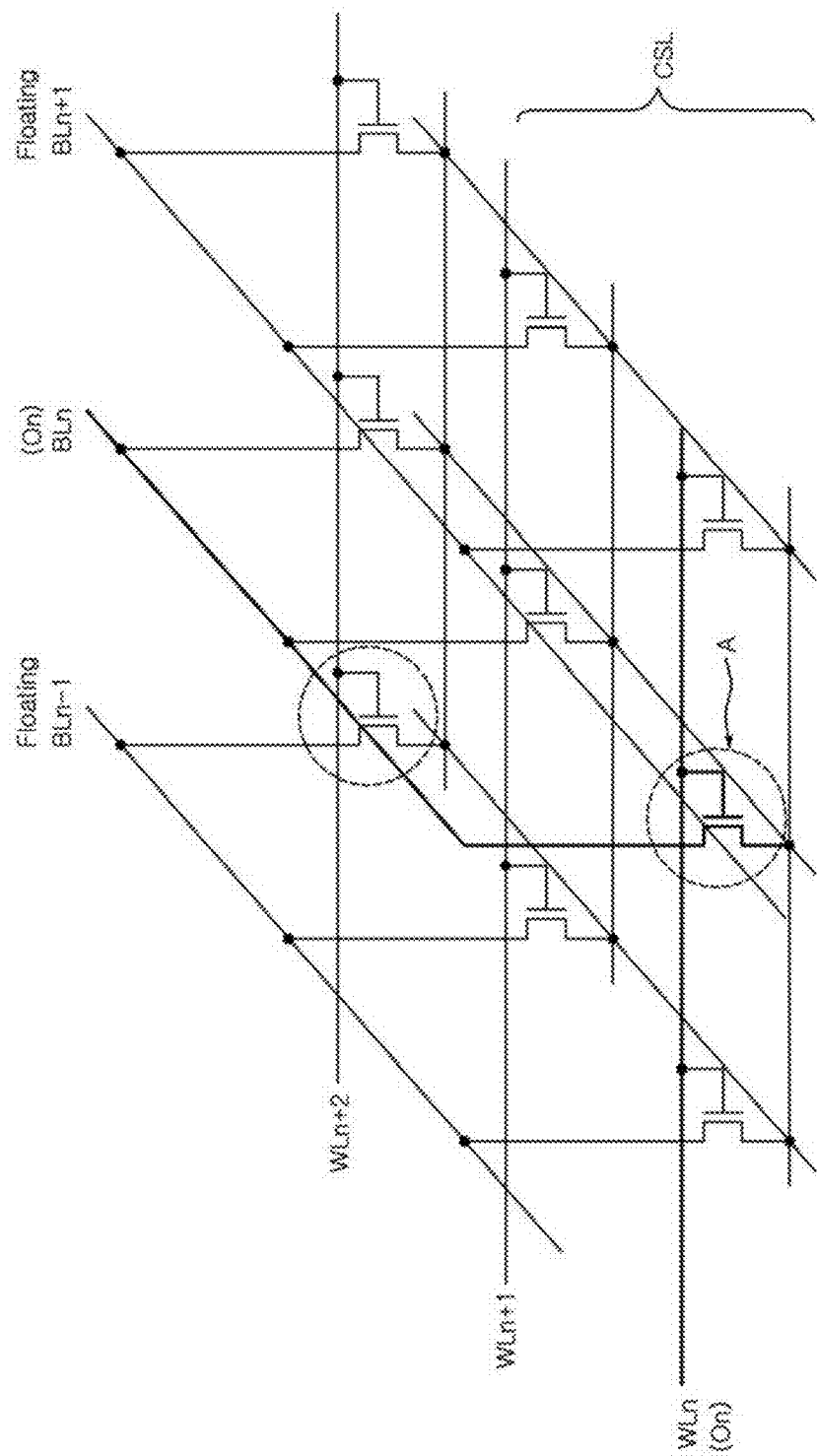
FIG. 14 is a circuit diagram illustrating an exemplary vertical memory device.

FIG. 14 is a circuit diagram of an exemplary vertical memory device.

Referring to FIG. 14, a plurality of memory cells are formed to be connected to bit lines and word lines. Each of the memory cells is formed to have a common source line CSL.

When a specific word line WLn and a specific bit line BLn are selected to select the transistor A, non-selected bit lines are controlled to be in a floating state. Since the memory cells share a channel region, when the non-selected bit lines are controlled to a ground potential, leakage current is generated through the non-selected bit lines. However, when the non-selected bit lines are controlled in the floating state illustrated in FIG. 14, the memory cells can perform a reliable operation with low current drivability without leakage current even when sharing the channel region.

As described above, in the exemplary implementation, when the vertical memory device is fabricated, the transistor is employed as the access element. Further, all memory cells or memory cells connected at least to the same bit line share the source line to reduce a source resistance.

Further, cells connected to the same word line share the channel region so that a stable and reliable operation can be performed with low current drivability and the driving voltage can be reduced.

Although the above-described exemplary implementations disclose that the vertical memory device is formed in a single-layered structure, the vertical memory device may be formed to have a stacked structure, such as a multi-level stack (MLS) structure. At this time, the vertical memory device may be applied and modified in various structures so that the memory cell structure illustrated in FIG. 7, 12, or 13 may be equally sequentially stacked, may be stacked to be symmetrical in a mirror type with respect to the bit line, or may be stacked to be symmetrical in a mirror type with respect to the source line.

The inventive concept may be modified to include various alternative implementations, as will be described below.

FIGS. 15 to 22 are views illustrating a method of fabricating an exemplary vertical memory device.

In FIGS. 15 to 22, (a) is a cross-sectional view of the vertical memory device in a second direction (an X-direction), for example, a bit line direction, (b) is a cross-sectional view of the vertical memory device in a first direction (a Y-direction), for example, a word line direction, and (c) is a layout diagram of the vertical memory device.

Figure 15:
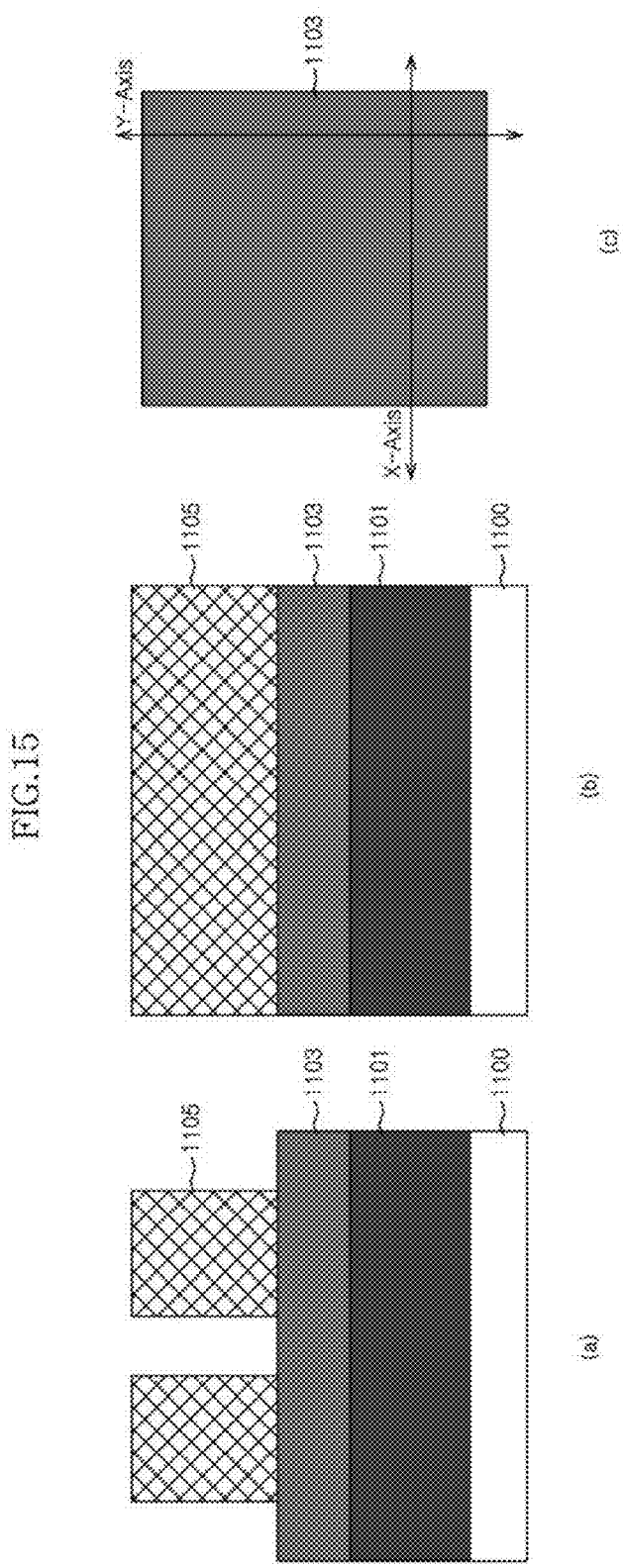
FIGS. 15 to 22 are views illustrating a method of fabricating an exemplary vertical memory device.

Referring to FIG. 15, a first junction region 1101, a channel region 1103, and a hard mask 1105 are sequentially formed on a semiconductor substrate 1100 and then the hard mask 1105 is line-patterned to the first direction, for example, to the word line direction. In the exemplary implementation, a thickness of the hard mask 1105 may be determined by considering thicknesses of a second junction region, a heating material, and a data storage material that are to be formed in a subsequent process.

The semiconductor substrate 1100 may include a semiconductor material such as Si, SiGe, or GaAs and may have a structure of a single layer or a combination layer thereof. Further, the first junction region 1101 and the channel region 1103 may be formed in an N type or a P type through an impurity implantation process.

Figure 16:
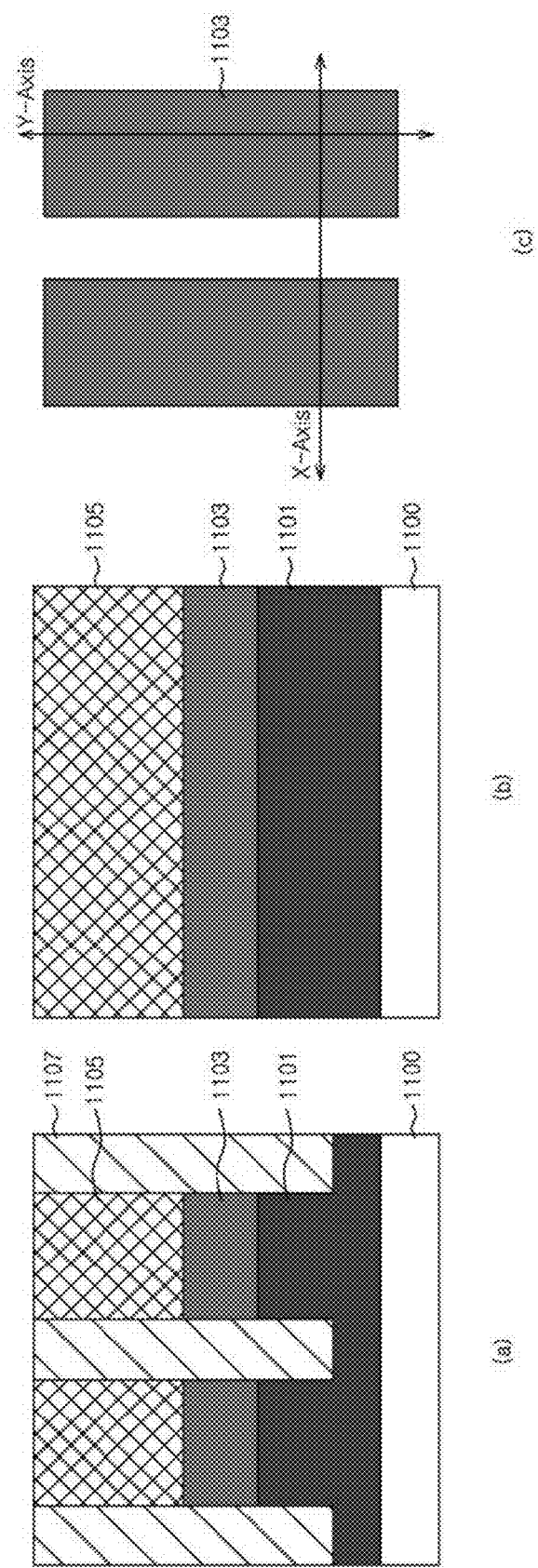

Referring to FIG. 16, the channel region 1103 and a portion of the first junction region 1101 are etched using the hard mask 1105. A first insulating layer 1107 is formed on the semiconductor substrate in which the channel region 1103 and the portion of the junction region 1101 are etched and then etched through a spacer etching process to expose an upper surface of the hard mask 1105. Here, the first junction region 1101 may be etched to a first depth.

FIG. 15(c) and FIG. 16(c) are layout diagrams in the channel region 103.

Figure 17:
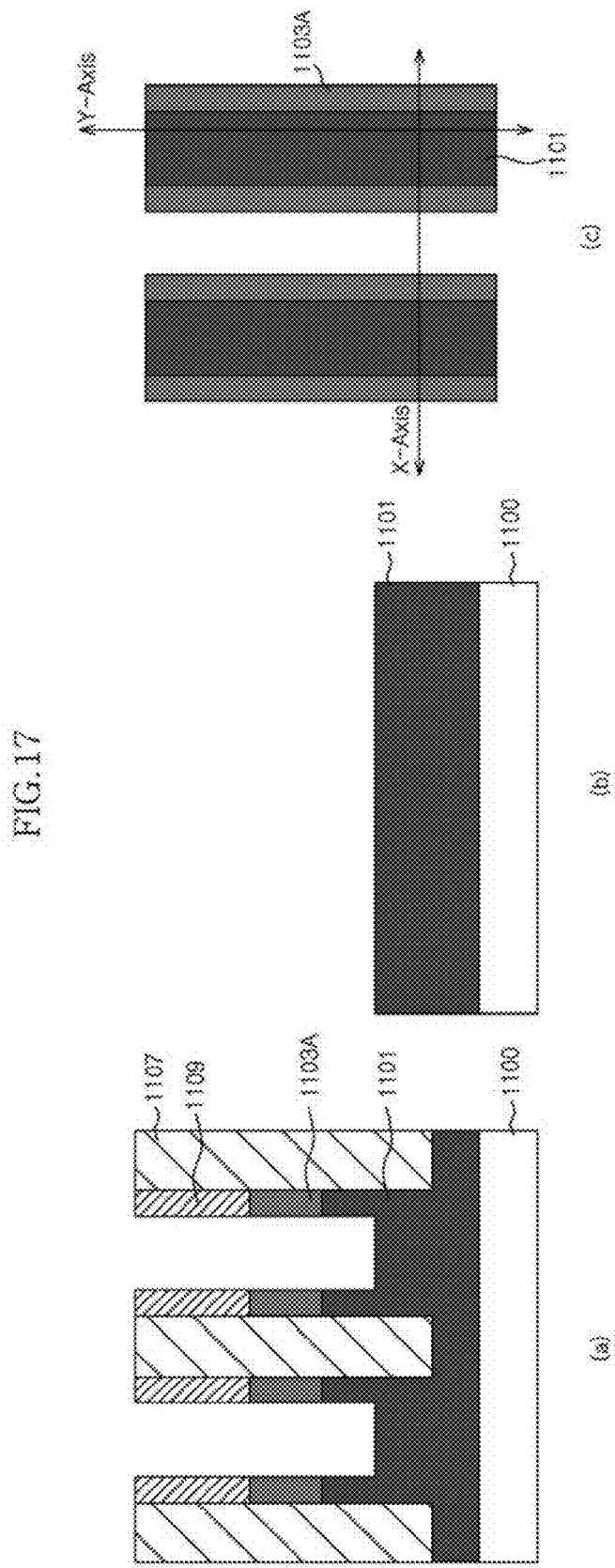

FIG. 17 illustrates a state in which the hard ask 1105 is removed, insulating layer spacers 1109 are formed on the exposed channel region 1103, and the channel region 1103 and a portion of the first junction region 1101 are etched using the insulating layer spacers 1109. At this time, the first junction region 1101 may be etched a second depth smaller than the first depth.

In FIG. 17, the etched channel regions 1103A defines a self-aligned trench in which a gate insulating layer and a conductive layer are to be buried in a subsequent process.

Figure 18:
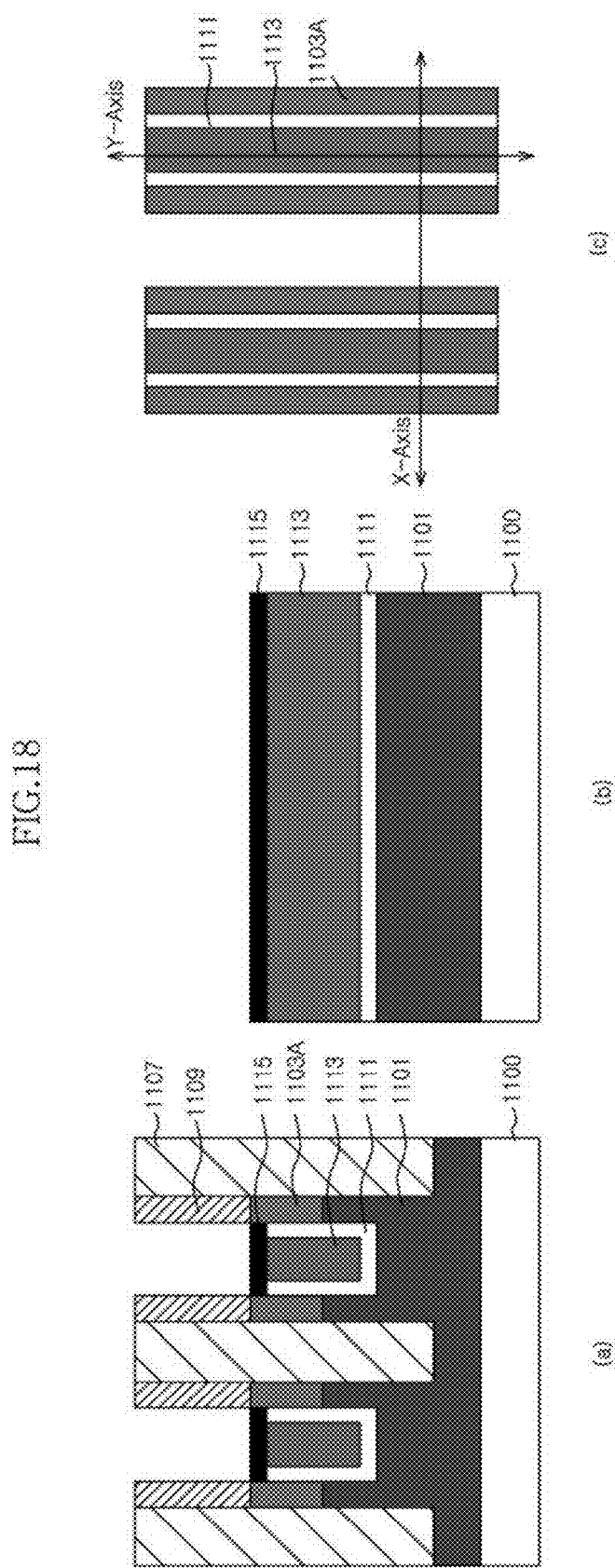

That is, as shown in FIG. 18, a gate insulating layer 1111 and a conductive layer 1113 are sequentially formed in the self-aligned trench defined by the etched channel regions 1103A and the first junction region 1101 and then are recessed. Then, a second insulating layer 1115 is formed on the recessed conductive layer 1113. The conductive layer 1113 serves as a gate electrode, that is, a word line.

In the exemplary implementation, the gate insulating layer 1111 may be formed of a single layer including oxide or nitride of, for example, Si, Ta, Ti, BaTi, BaZr, Zr, Hf, La, Al, Y, ZrSi, or a combination layer thereof.

Further, the conductive layer 1113 may be formed using metal, an alloy, metal oxynitride, or a conductive carbon compound. For example, the conductive layer 1113 may be formed, for example, of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti W, Mo, Ta, TiSi, TaSi, TiW, TiON, TiAlON, WON, or TaON, but the conductive layer is not limited thereto.

In the exemplary implementation, the second insulating layer 1115 formed on the conductive layer 1113 serves to insulate the conductive layer 1113 and a second junction region that is to be formed in a subsequent process. The second insulating layer 1115 may be formed by oxidizing a conductive layer 1113 or by depositing a separate insulating material.

FIG. 18(c) illustrates a state in which the conductive layer 1113 is formed in the self-aligned trench defined by the etched channel regions 1103A and the first junction region 1101 to be insulated from the etched channel regions 1103A by the gate insulating layer 1111.

Figure 19:
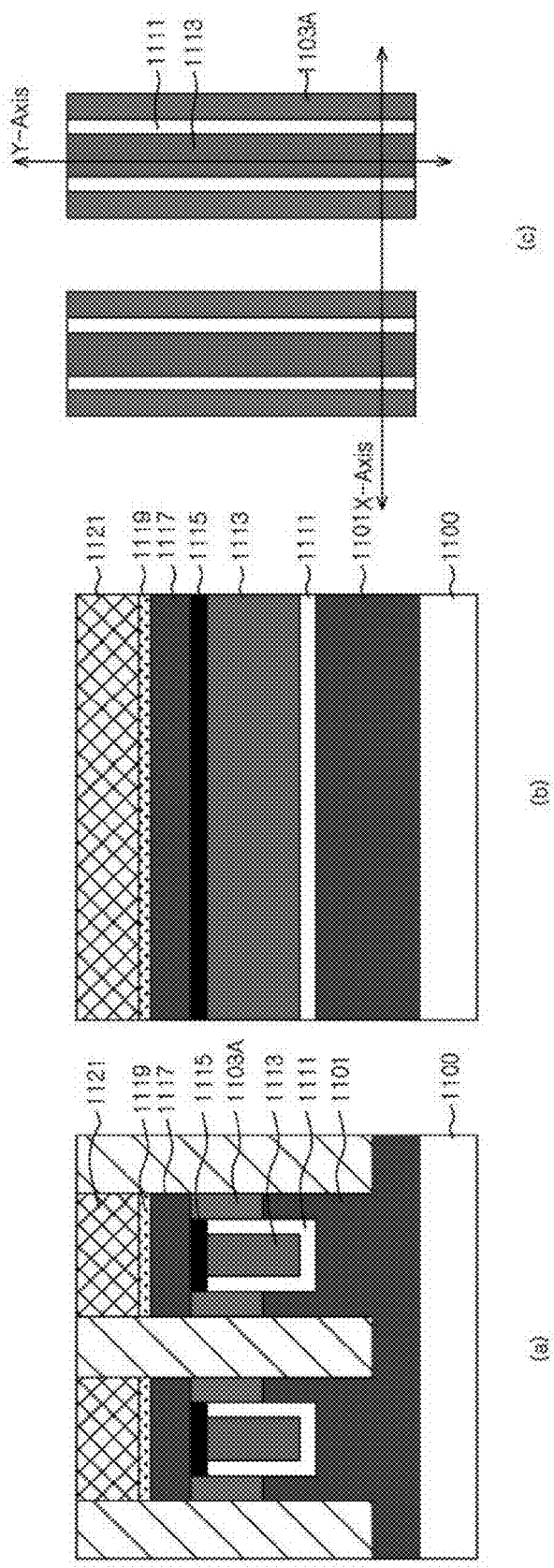

Referring to FIG. 19, the insulating layer spacer 1109 is removed to expose the etched channel regions 1103A and a second junction region 1117, a heating material 1119, and a sacrificial layer 1121 are sequentially formed on the exposed etched channel regions 1103A and the second insulating layer 1115 to be buried in the space from which the hard mask 1105 is removed.

The second junction region 1117 may be formed through an ion implantation process and constitutes the access element, that is, the transistor together with the first junction region 1101, the channel regions 1103A, and the conductive layer 1113.

Further, the access element, that is, the transistor may be formed in an NMOS type, a PMOS type, or an I-MOS type according to a conductivity type of an impurity injected into the first junction region 1101, the channel regions 1103A, and the second junction region 1117. Specifically, the transistor may be formed in the NMOS type by considering a threshold voltage and the like.

When the NMOS type transistor is formed, N type ions may be implanted into the first junction region 1101 and the second junction region 1117 and P type ions may be implanted into the channel regions 1103A. When the PMOS type transistor is formed, P type ions may be implanted into the first junction region 1101 and the second junction region 1117 and N type ions may be implanted into the channel regions 1103A.

When the I-MOS type transistor is formed, N+ type ions may be implanted into the first junction region 1101, P+ type ions may be implanted into the second junction region 1117, and P− type ions, N− type ions, or a combination thereof may be implanted into the channel regions 1103A. Alternatively, P+ type ions may be implanted into the first junction region 1101, N+ type ions may be implanted into the second junction region 1117, and P− type ions, N− type ions, or a combination thereof may be implanted into the channel regions 1103A.

In an alternative implementation, the second junction region 1117 may be formed of a silicide layer. In this case, the access element using a Schottky barrier between the channel region 1103A and the second junction region 1117 may be configured.

The first junction region 1101 may serve as a source region and the second junction region 1117 may serve as a drain region.

The sacrificial layer 1121 may be formed of a hard mask and may be removed in a subsequent process to be replaced with a data storage material, for example, a variable resistive material.

The heating material 1119 may be formed using metal, an alloy, metal oxynitride, or a conductive carbon compound. For example, the heating material may be formed of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, or TaON or of a semiconductor material, such as doped polysilicon, or silicon germanium (SiGe). Further, the heating material 1119 may include two or more conductive layers.

Although not shown, a silicide layer may be further formed between the second junction region 1117 and the heating material 119. The silicide layer may be formed, for example, of Ti, Co, Ni, W, Pt, Pb, Mo, or Ta, but the silicide layer is not limited thereto.

Figure 20:
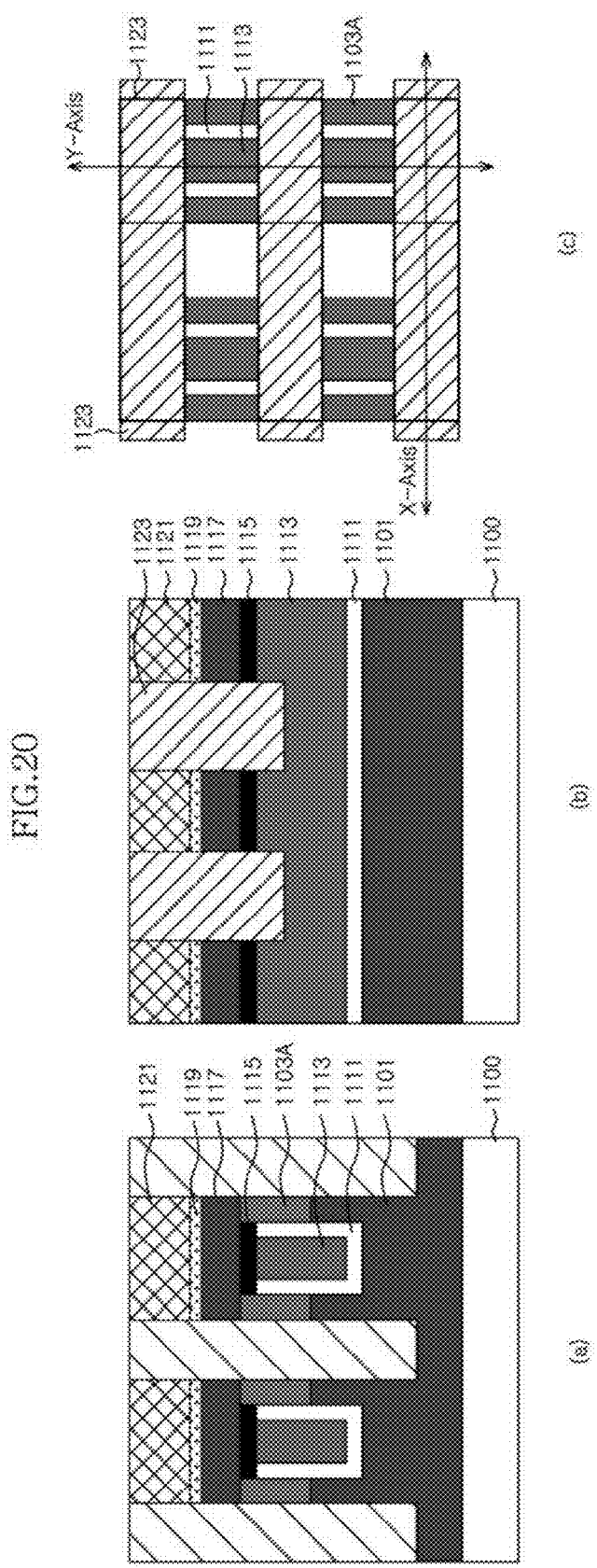

Next, referring to FIG. 20, the sacrificial layer 1121, the heating material 1119, the second junction region 1117, the second insulating layer 1115, and a portion of the conductive layer 1113 are patterned to the second direction. A third insulating layer 1123 is formed on the semiconductor substrate including the patterned layers and then planarized to expose an upper surface of the sacrificial layer 1121.

Here, the conductive layer 1113 may not be entirely patterned but etched to a predetermined depth and thus memory cells are formed to share the word line.

Figure 21:
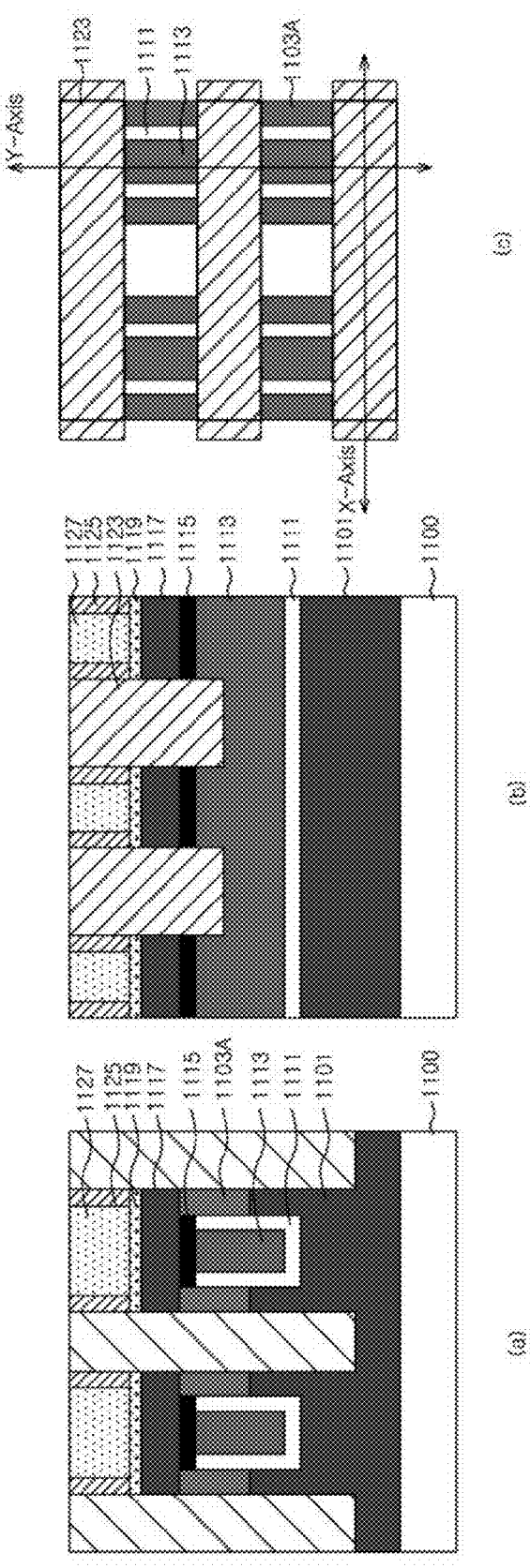

FIG. 21 illustrates a state in which the sacrificial layer 1121 is removed and a data storage material 1127 is formed in a space from which the sacrificial layer 1121 is removed. In the exemplary implementation, after the sacrificial layer 1121 is removed, a spacer 1125 may be formed on an inner sidewall of the space from which the sacrificial layer 1121 is removed and the data storage material 1127 may be buried in the space.

The data storage material 1127 may include one selected from the group consisting of a material for a PCRAM, a material for a ReRAM, a material for a MRAM, a material for a STTMRAM, and a material for a PoRAM. For example, when the vertical memory device is a PCRAM, the data storage material may be formed of Te, Se, Ge, Sb, Bi, Pb Sn, As, S, Si, P, O, N, a compound thereof, or an alloy thereof.

Figure 22:
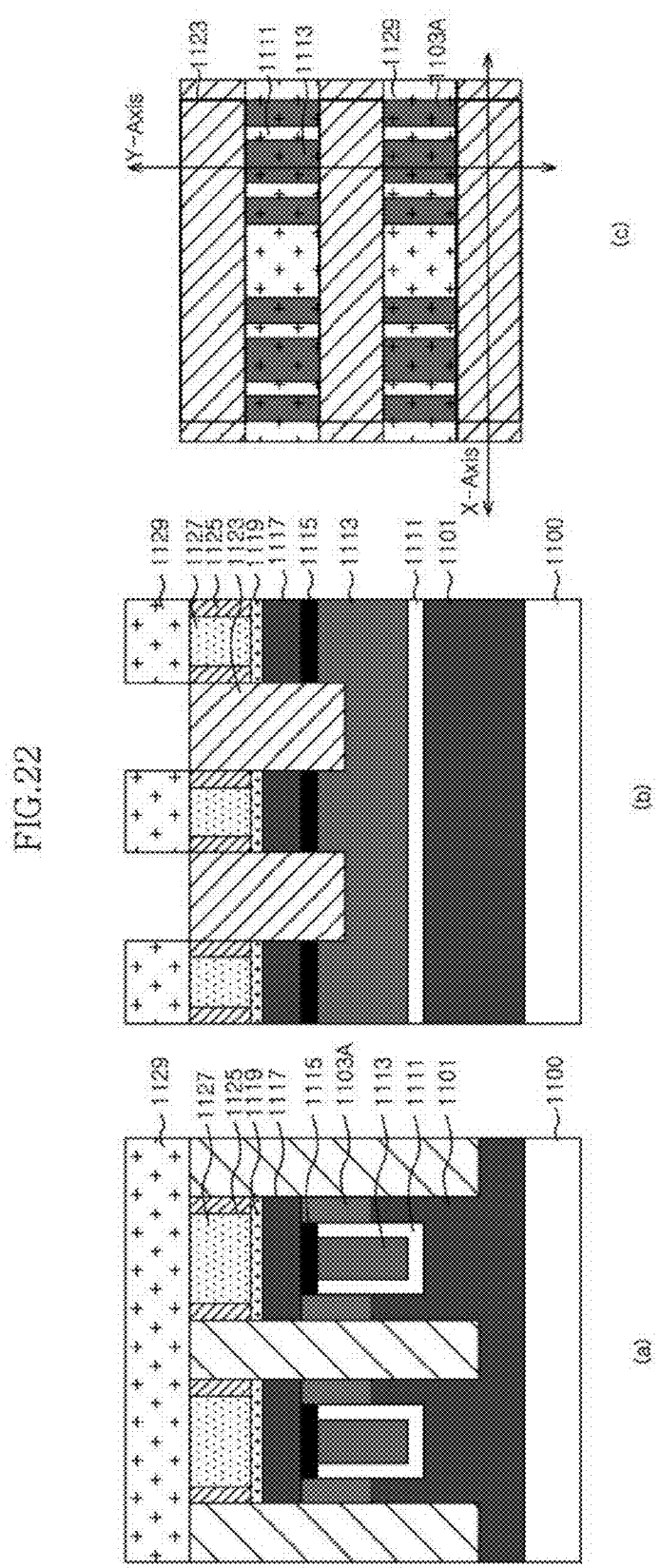

Referring to FIG. 22, a bit line 1129 is formed to the second direction to be in contact with the data storage material 1127.

Figure 23:
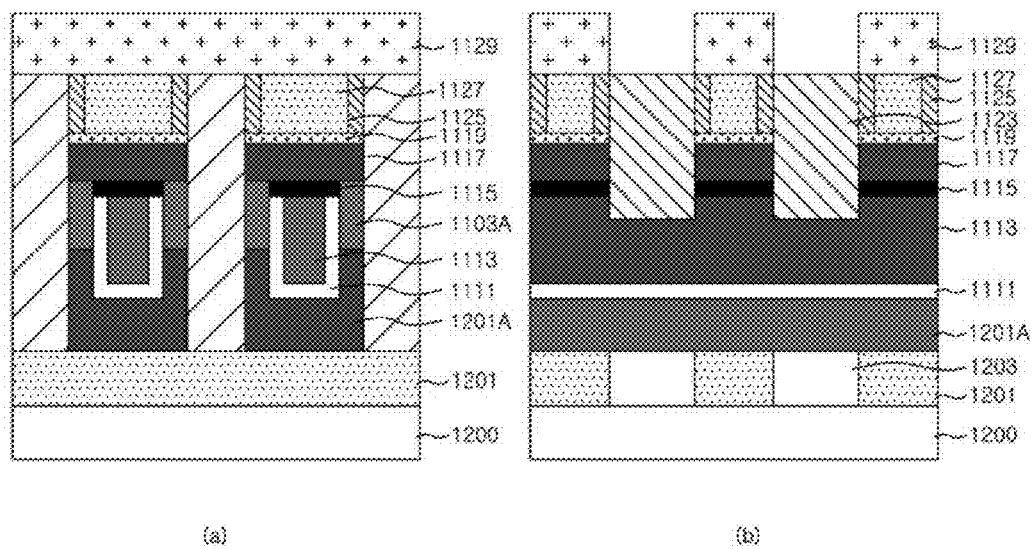
FIG. 23 is a cross-sectional view illustrating an exemplary vertical memory device.

FIG. 23 is a cross-sectional view illustrating an exemplary vertical memory device.

In the vertical memory device according to the exemplary implementation, a first junction region 1201 and 1201A includes a common junction region 1201 line-patterned to a second direction, that is, a bit line direction and a switching junction region 1201A. The vertical memory device according to the exemplary implementation has substantially the same structure as the vertical memory device illustrated in FIG. 22 other than the first junction region 1201 and 1201A. An insulating layer 1203 may be further formed between the line-type common junction regions 1201.

Further, the common junction region 1201 and the switching junction region 1201A may be formed of different materials from each other.

Figure 24:
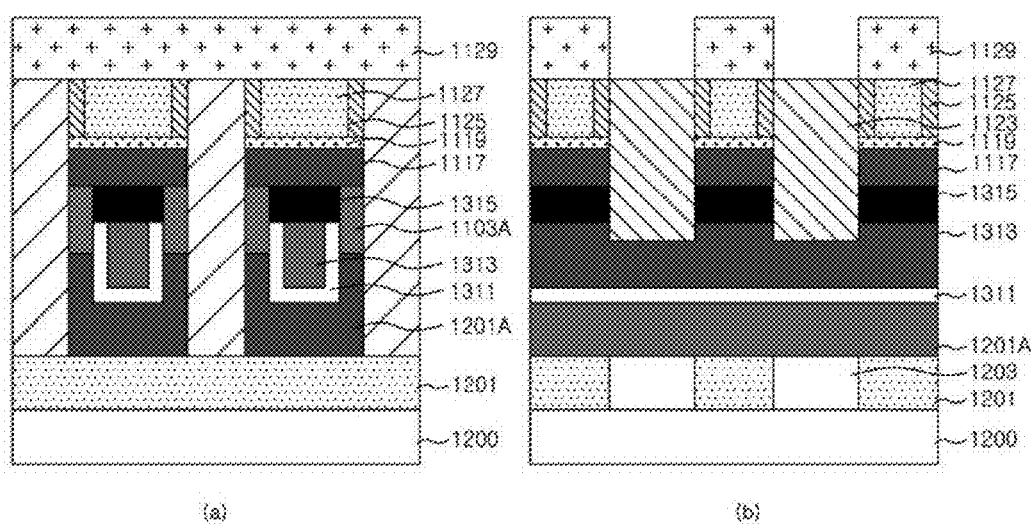
FIG. 24 is a cross-sectional view illustrating an exemplary vertical memory device.

FIG. 24 is a cross-sectional view illustrating an exemplary vertical memory device. Like reference numerals in the FIG. 22 denote like elements in FIG. 24.

In the exemplary vertical memory device, if a conductive layer 1313 is formed in a self-aligned trench defined an etched channel region 1103A, then an amount of channel region (see 1103 of FIG. 16) recessed is increased so that the conductive layer 1313 is formed to have a lower height than the conductive layer 1113 of FIG. 22. Therefore, a second insulating layer 1315 is increased in a thickness and the reference numeral 1311 denotes a gate insulating layer.

Figure 25:
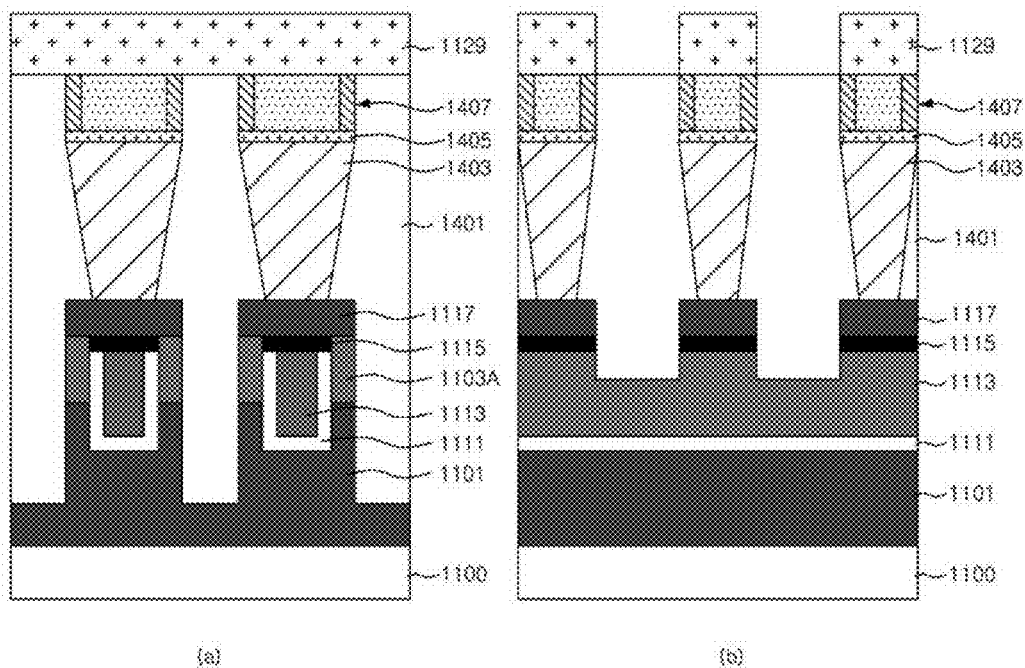
FIG. 25 is a cress-sectional view illustrating an exemplary vertical.

FIG. 25 is a cross-sectional view illustrating an exemplary vertical memory device.

Referring to FIG. 25, a first junction region 1101, a channel region 1103, and a hard mask are sequentially formed on a semiconductor substrate 1100 and then line-patterned to the first direction (a word line direction). In the exemplary implementation, the hard mask may be formed by considering a height of a second junction region to be formed in a subsequent process.

Next, a first insulating layer 1107 is formed on the semiconductor substrate including the first junction region 1101, the channel region 1103, and the hard mask line-patterned and then planarized to expose an upper surface of the hard mask. The exposed hard mask is removed and an insulating layer spacer is formed on the channel region 1103 in the space from the hard mask is removed.

The channel region 1103 and a portion of the first junction region 1101 are etched using the insulating layer spacer to form a self-aligned trench. A gate insulating layer 1111 and a conductive layer 1113 are formed in the self-aligned trench and then recessed. A second insulating layer 1115 is formed in the recessed portion, the insulating layer spacer is removed, and a second junction region 1117 is formed on the second insulating layer 1115.

After the vertical transistors sharing the first junction region 1101 and an etched channel region 1103A are formed through the above-described process, a data storage material is connected to each of the transistors through each of contacts.

That is, referring back to FIG. 25, an insulating layer 1401 is formed on the semiconductor substrate including the second junction region 1117 and a contact hole having a predetermined diameter is formed in the insulating layer 1401 to expose an upper surface of the second junction region 1117.

Conductive material layers 1403 and 1405 having predetermined depth and a data storage material 1407 are formed to be buried in the contact hole and a bit line 1129 is formed on the data storage material 1407.

Here, the conductive material layers 1403 and 1405 may include a contact plug 1403 and a heating material 1405. Further, the data storage material 1407 may be configured that a spacer is formed on an outer circumference of the data storage material 1407.

The vertical memory devices having the above-described various structures have illustrated that the bit line has a line-patterned structure as an example, but the bit line may be patterned in an island type. In this case, interference between cells can be suppressed.

Figure 26:
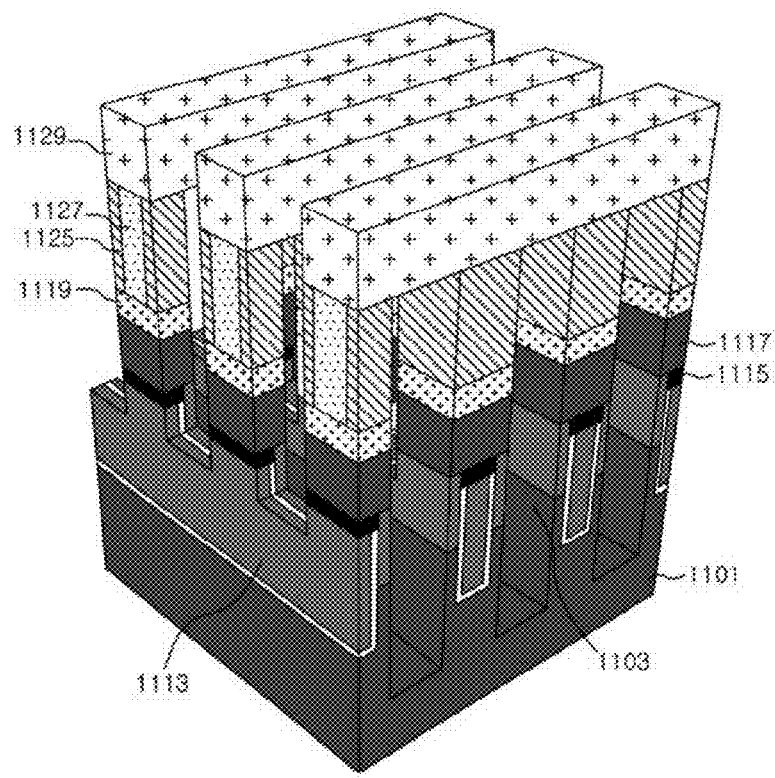
FIGS. 26 to 29 are perspective views illustrating the exemplary vertical memory device illustrated in FIG. 22.
Figure 27:
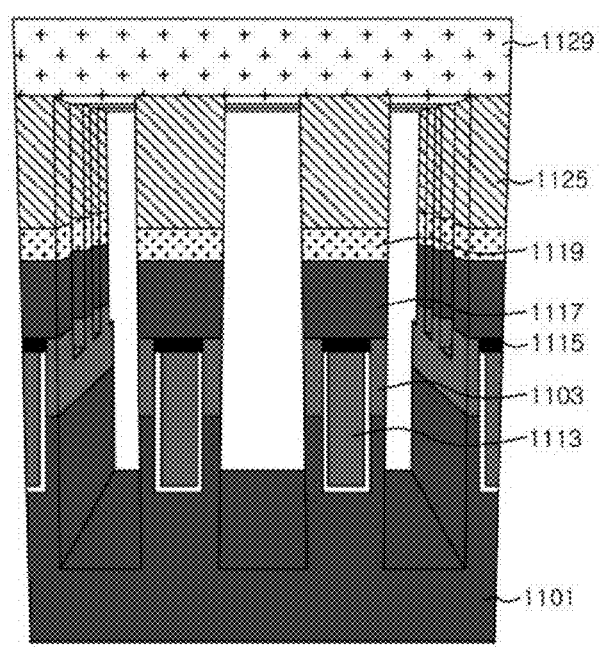
Figure 28:
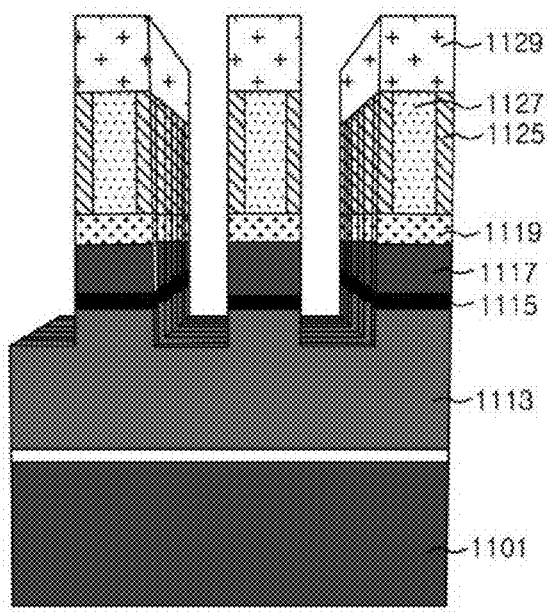
Figure 29:
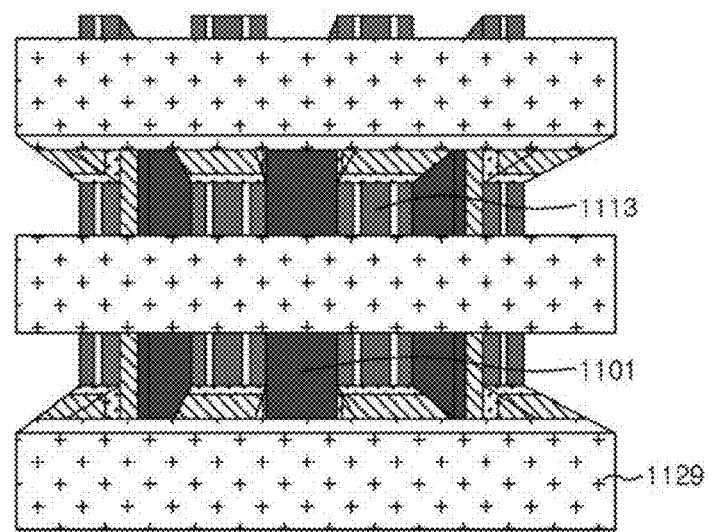

FIGS. 26 to 29 are views illustrating the vertical memory device illustrated in FIG. 22, wherein. FIG. 26 is a perspective view, FIG. 27 is a front perspective view, FIG. 28 is a side perspective view, and FIG. 29 is a top perspective view.

As illustrated in FIG. 26, all memory cells share the first junction region 1101, that is a source region, while memory cells connected to the same word line 1113 share the channel region 1103.

Further, the word line 1113 is formed between the channel regions 1103 in a self-aligned manner.

When the word line 1113 and the bit line 1129 are selected according to an address received from the outside to turn on a specific transistor, a resistance component formed through drain-channel-source can be reduced through sharing of the source region 1101 to ensure a reliable operation with low current drivability.

At this time, non-selected bit lines are controlled to be in a floating state to prevent current leakage through the non-selected bit lines.

Figure 30:
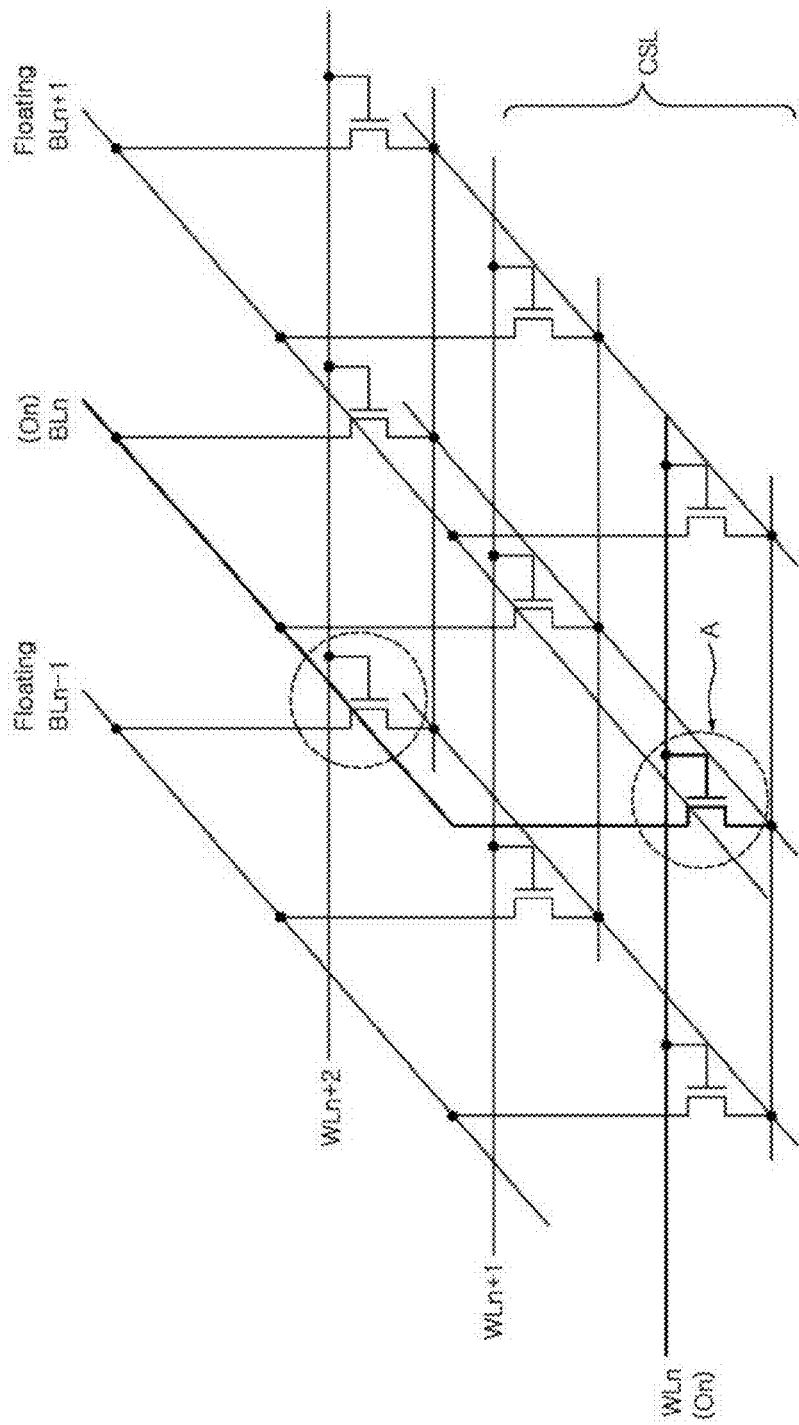
FIG. 30 is a circuit diagram illustrating an exemplary vertical memory device.

FIG. 30 is a circuit diagram of an exemplary vertical memory device according to an exemplary implementation of the inventive concept.

Referring to FIG. 30 a plurality of memory cells are formed to be connected to bit lines and word lines. Each of the memory cells is formed to have a common source line CSL.

When a specific word line WLn and a specific bit line BLn are selected to select the transistor A, non-selected bit lines are controlled to be in a floating state. Since the memory cells share a channel region, when the non-selected bit lines are controlled to a ground potential, leakage current is generated through the non-selected bit lines. However, when the non-selected bit lines are controlled in the floating state as shown in FIG. 30, the memory cells can perform a reliable operation with low current drivability without leakage current even when sharing the channel region.

Figure 31:
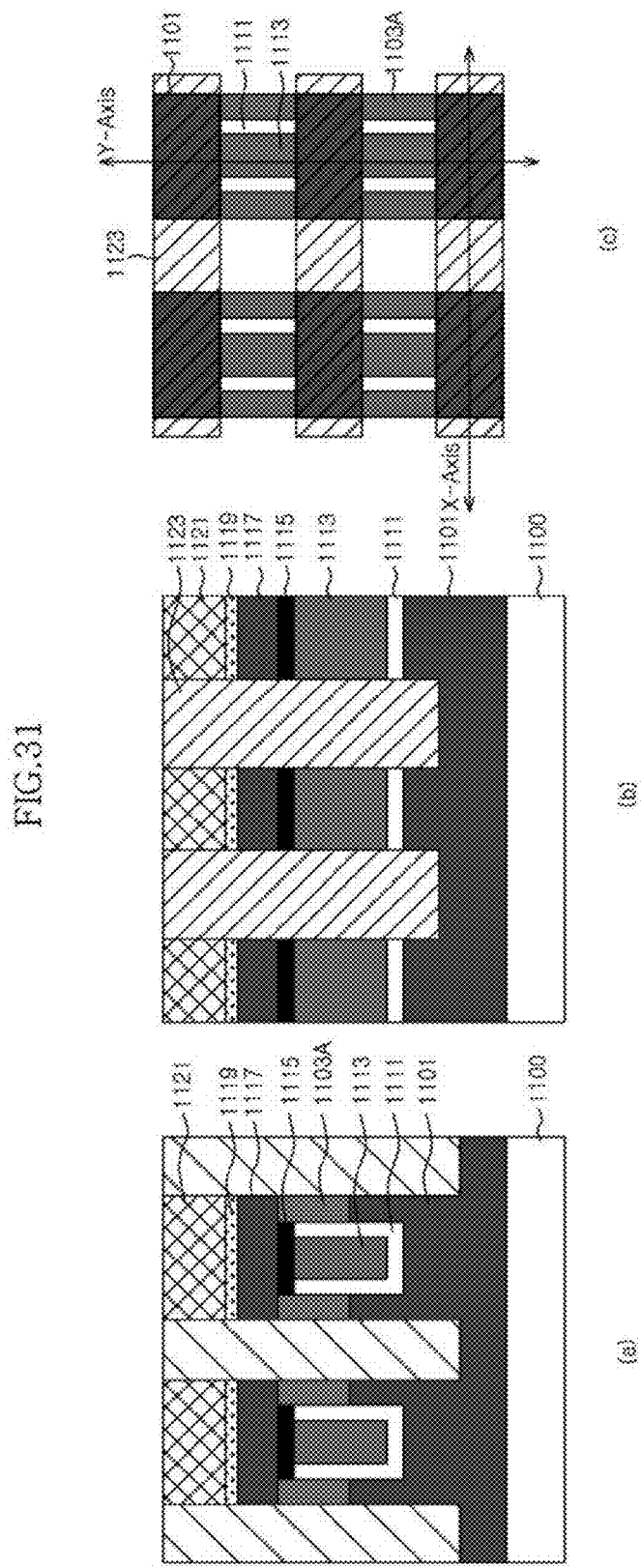
FIGS. 31 to 33 are views illustrating a method of fabricating an exemplary vertical memory device.
Figure 32:
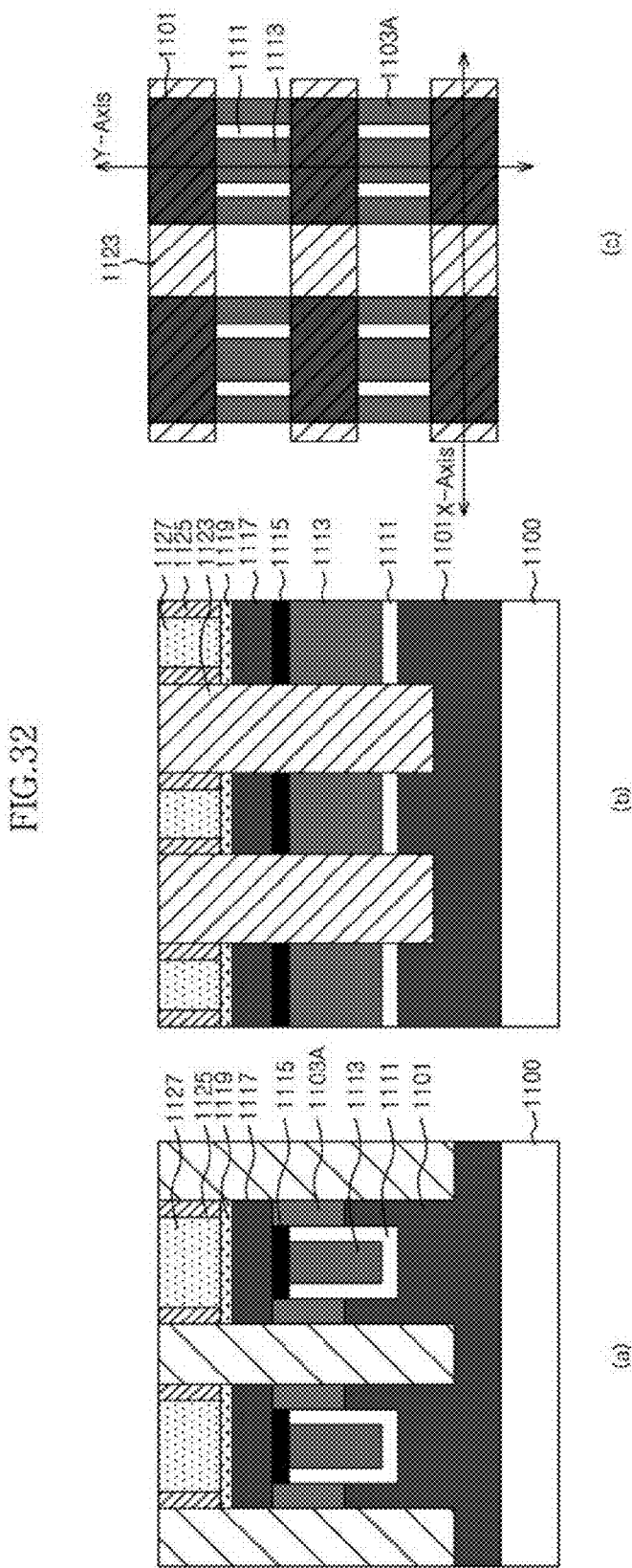
Figure 33:
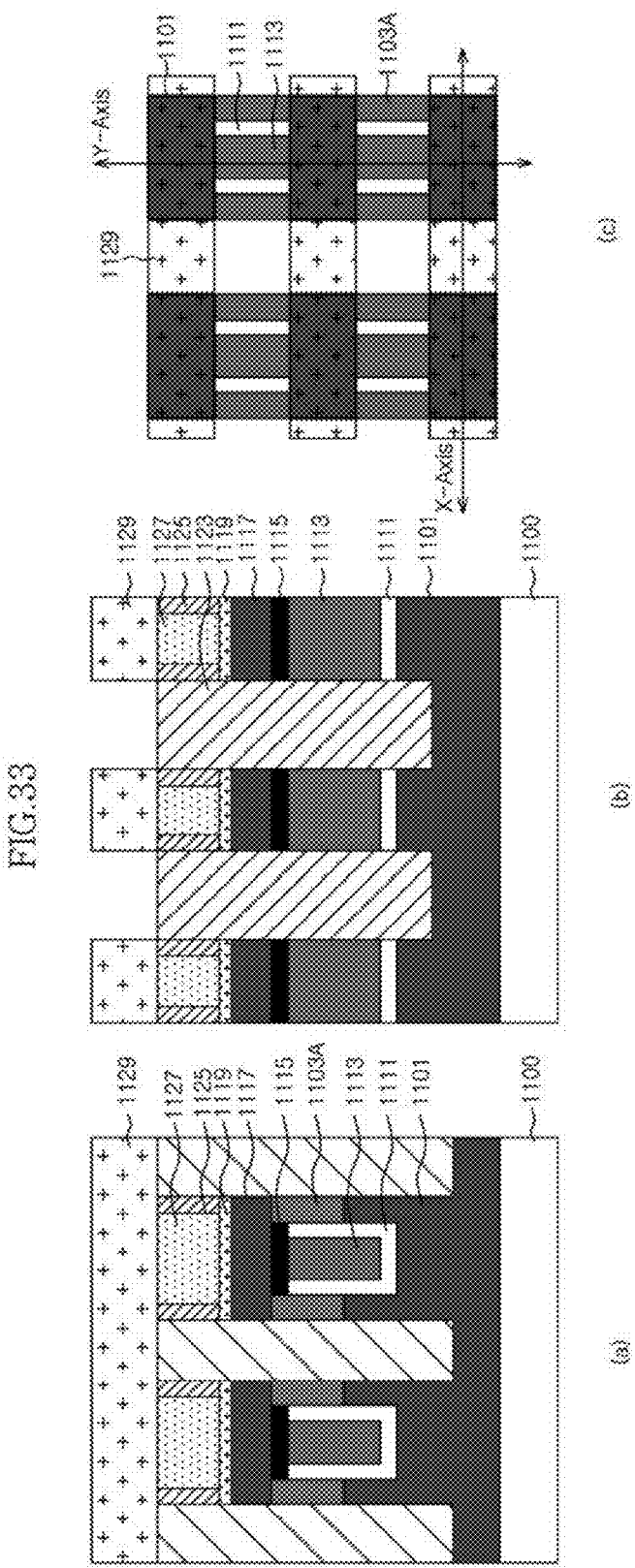

FIGS. 31 to 33 are views illustrating a method of fabricating an exemplary vertical memory device.

The exemplary vertical memory device has a structure in which memory cells share only a first junction region 1101 and a channel region 1103A and a second junction region 1117 are insulated from each other.

More specifically, first, a vertical access element and a heating material 1119 are formed through the method illustrated in FIGS. 15 to 19.

Referring to FIG. 31, a sacrificial layer 1121, the heating material 1119, a second junction region 1117, a second insulating layer 1115, a conductive layer 1113, a gate insulating layer 111, and a portion of a first junction region 1101 are patterned to a second direction to achieve insulation between cells in a first direction. Next, a third insulating layer 1123 is formed on the semiconductor substrate including the patterned layers and then planarized to expose an upper surface of the sacrificial layer 1121.

Here, the first junction region 1101 may not be entirely patterned but etched to a predetermined depth and thus all memory cells can share the first junction region 1101, that is, a source region. Further, the second junction region 1117, that is, a drain region and a channel region 1103 are separated between memory cells.

FIG. 32 illustrates a state in which the sacrificial 1121 is removed and a data storage material 1127 is formed in a space from the sacrificial layer 1121 is removed.

In the exemplary implementation, after the sacrificial 1121 is removed, a spacer 1125 may be formed on an inner sidewall of the space from the sacrificial layer 1121 is removed and the data storage material 1127 may be buried in the space.

The data storage material 1127 may include one selected from the group consisting of a material for a PCRAM, a material for a ReRAM, a material for a MRAM, a material for a STTMRAM, and a material for a PoRAM. For example, when the vertical memory device is a PCRAM the data storage material may be formed of Te, Se, Ge, Sb, Bi, Pb Sn, As, S, Si, P, O, N, a compound thereof, or an alloy thereof.

Referring to FIG. 33, a bit line 1129 is formed to a second direction to be in contact with the data storage material 1127.

Therefore, the memory cells can be operated in a state in which only the source region is shared and the drain region and the channel region are insulated between cells.

As described above, when the exemplary vertical memory device is fabricated, the transistor is employed as the access element. Further, all memory cell or memory cells connected at least to the same bit line share the source line to reduce a source resistance.

Further, cells connected to the same word line share the channel region so that a stable and reliable operation can be performed with low current drivability and the driving voltage can be reduced.

Further, since the word line is formed between the channel regions in a self-aligned manner, although a reduction rate of devices is increased, it is possible to precisely control the process and thus to increase fabrication yield.

Although the above-described exemplary implementation have described that the vertical memory device is formed in a single-layered structure, the vertical memory device in the inventive concept may be formed to have a stacking structure, that is, a multi-level stack (MLS) structure. At this time, the vertical memory device may be applied and modified in various structures so that the memory cell structure illustrated in FIG. 22, 23, 24, or 25 may be equally sequentially stacked, may be stacked to be symmetrical in a mirror type with respect to the bit line, or may be stacked to be symmetrical in a mirror type with respect to the source line.

The above exemplary implementations are is illustrative and not limitative. Various alternatives and equivalents are possible. The invention is not limited by the implementations described herein. Nor is the invention limited to any specific type of semiconductor device. Other additions, subtractions, or modifications are obvious in view of the present disclosure and are intended to fall within the scope of the appended claims.

What is claimed is:

1. A vertical memory device, comprising:
   a common source region;
   source regions formed on the common source region and extending in a first direction;
   channel regions formed on each of the source regions, the channel regions extending in the first direction;
   trenches formed between the channel regions;
   a drain region formed on each of the channel regions;
   a conductive layer formed on a side of each of the channel regions, the conductive layer extending to the first direction; and
   a data storage material formed on each of the drain regions.

2. The vertical memory device of claim 1, wherein the common source region extends in the first direction and a second direction perpendicular to the first direction.

3. The vertical memory device of claim 1, wherein the common source region extends in a second direction perpendicular to the first direction.

4. The vertical memory device of claim 1, further comprising:
   a heating material interposed between each of the drain regions and each of the data storage materials.

5. The vertical memory device of claim 1, further comprising:
   a bit line, arranged in the second direction perpendicular to the first direction, disposed on the data storage materials.

6. The vertical memory device of claim 1, wherein the data storage material includes a variable resistive material.

7. The vertical memory device of claim 4, further comprising:
   a contact plug interposed between each of the drain regions and each of the heating materials.

8. The vertical memory device of claim 5, wherein the vertical memory device is formed on the bit line at least two times.

9. The vertical memory device of claim 5, wherein the vertical memory device is symmetrical with respect to the bit line.

10. The vertical memory device of claim 5, wherein the vertical memory device is symmetrical with respect to the common source region.

11. A method of fabricating a vertical memory device, the method comprising:
   sequentially forming, on a semiconductor substrate, a first junction region, a channel region, and a second junction region;
   line-patterning the second junction region, the channel region, and a portion of the first junction region to a first direction to form a line-patterned structure;
   forming spacers, made of first insulating layers, and conductive layers on outer sidewalls of the line-patterned structure;
   forming second insulating layers on the semiconductor substrate, including the spacers and the conductive layers, and planarizing the second insulating layers to expose the second junction region and the conductive layers;
   removing, to a predetermined depth, exposed portions of the conductive layers and forming third insulating layers in spaces from which the exposed portions of the conductive layers are removed; and
   patterning the second junction region and a portion of the channel region in a second direction perpendicular to the first direction,
   wherein the first junction region includes a common junction region and a switching junction region extending in the first direction.

12. The method of claim 11, wherein the common junction region extends in the first direction and the second direction.

13. The method of claim 11, wherein the common junction region is formed through line-patterning in the second direction.

14. The method of claim 11, wherein the removing the exposed portions of the conductive layers to a predetermined depth includes removing the exposed portions of the conductive layers so that remaining portions of the conductive layers overlap the channel region.

15. The method of claim 11, further comprising:
   forming a data storage material, to be electrically connected to the second junction region, after the patterning the second junction region and the channel region in a second direction perpendicular to the first direction.

16. The method of claim 15, wherein the data storage material is formed using a variable resistive material.

17. A method of fabricating a vertical memory device, the method comprising:
   sequentially forming a first junction region, a channel region, a second junction region, a heating material, and a sacrificial layer on a semiconductor substrate;
   line-patterning, in a first direction, the sacrificial layer, the heating material, the second junction region, the channel region, and a portion of the first junction region to form a line-patterned structure;
   forming spacers, made of first insulating layers, and conductive layers on outer sidewalls of the line-patterned structure;
   forming second insulating layers on the semiconductor substrate, including the spacers and the conductive layers, and planarizing the second insulating layers to expose the sacrificial layer and the conductive layers;
   removing, to a predetermined depth, the exposed portions of the conductive layers and forming third insulating layers in spaces from which the exposed portions of the conductive layers are removed;
   patterning, in a second direction perpendicular to the first direction, the sacrificial layer, the heating material, the second junction region, and a portion of the channel region; and
   forming a data storage material in a space from which the sacrificial layer is removed.

18. The method of claim 17, wherein the first junction region includes a common junction region and a switching junction region that is line-patterned to extend in first direction.

19. The method of claim 17, wherein the removing the exposed portions of the conductive layers to a predetermined depth includes removing the exposed portions of the conductive layers so that remaining portions of the conductive layers overlap the channel region.

20. The method of claim 17, wherein the data storage material is formed using a variable resistive material.

21. The method of claim 18, wherein the common junction region extends in the first direction and the second direction.

22. The method of claim 18, wherein the common junction region is formed through line-patterning in the second direction.

23. A vertical memory device, comprising:
   a common source region;

source regions formed on the common source region, the source regions extending in a first direction;

channel regions formed on each of the source regions, the channel regions extending in the first direction;

a conductive layer formed on each of the source regions in a space between each of the channel regions;

a drain region formed on each of the conductive layers; and a data storage material formed on each of the drain regions.

24. The vertical memory device of claim 23, wherein the common source region extends in the first direction and a second direction perpendicular to the first direction.

25. The vertical memory device of claim 23, wherein the common source region extends in a second direction perpendicular to the first direction.

26. The vertical memory device of claim 23, further comprising:

a heating material interposed between each of the drain regions and each of the data storage materials.

27. The vertical memory device of claim 23, further comprising:

a bit line, arranged in a second direction perpendicular to the first direction, on the data storage materials.

28. The vertical memory device of claim 23, wherein a height of the conductive layer is less than or equal to a height of the channel regions.

29. The vertical memory device of claim 23, wherein the data storage material includes a variable resistive material.

30. The vertical memory device of claim 26, further comprising:

a contact plug interposed between each of the drain regions and each of the heating materials.

31. The vertical memory device of claim 27, wherein the vertical memory device is formed on the bit line at least two times.

32. The vertical memory device of claim 27, wherein the memory device is formed symmetrically with respect to the bit lines.

33. The vertical memory device of claim 27, wherein the memory device is formed symmetrically with respect to the common source region.

34. A vertical memory device, comprising:

a common source region;

source regions formed on the common source region and extending in a first direction;

trenches formed between the source regions to a predetermined depth;

a channel region formed on each of the source regions and extending in the first direction;

a conductive layer formed on each of the source regions in a space between the channel regions;

a drain region formed on the conductive layer; and a data storage material formed on each of the drain regions.

35. The vertical memory device of claim 34, wherein the common source region extends in the first direction and a second direction perpendicular to the first direction.

36. The vertical memory device of claim 34, wherein the common source region extends in a second direction perpendicular to the first direction.

37. The vertical memory device of claim 34, further comprising:

a heating material interposed between each of the drain regions and each of the data storage materials.

38. The vertical memory device of claim 34, further comprising:

a bit line, arranged in a second direction perpendicular to the first direction, on the data storage materials.

39. The vertical memory device of claim 34, wherein a height of the conductive layer is less than or equal to a height of the channel regions.

40. The vertical memory device of claim 34, wherein the data storage material includes a variable resistive material.

41. The vertical memory device of claim 37, further comprising:

a contact plug interposed between each of the drain regions and each of the heating materials.

42. The vertical memory device of claim 38, wherein the vertical memory device is formed on the bit line at least two times.

43. The vertical memory device of claim 38, wherein the vertical memory device is formed symmetrically with respect to the bit lines.

44. The vertical memory device of claim 38, wherein the vertical memory device is formed symmetrically with respect to the common source region.

45. A method of fabricating a vertical memory device, the method comprising:

sequentially forming, in a first direction, a first junction region, a channel region, and a hard mask line-patterned;

line-patterning the channel region and a portion of first junction region to form a line-patterned structure;

forming a first insulating layer on an outer sidewall of the line-patterned structure and;

removing the hard mask;

forming an insulating layer spacer on an inner sidewall of the first insulating layer on the channel region;

etching the exposed channel region and a portion of the first junction region to form a self-aligned trench;

sequentially forming a gate insulating layer and a conductive layer in the self-aligned trench;

recessing the conductive layer so that the conductive layer overlaps the channel region; and forming a second junction region and a data storage material on the conductive layer.

46. The method of claim 45, wherein the first junction region is includes a common junction region and a switching junction region extending in the first direction.

47. The method of claim 45, wherein the forming a second junction region further comprises:

removing the insulating layer spacer; and forming the second junction region on the exposed channel region and conductive layer.

48. The method of claim 47, further comprising:

forming a heating material and a sacrificial layer on the second junction region;

patterning the sacrificial layer, the heating material, the second junction region, the conductive layer, the gate insulating layer, and a portion of the first junction region in a second direction perpendicular to the first direction; and forming the data storage material on the heating material exposed by the removal of the sacrificial layer.

49. The method of claim 47, wherein the forming the second junction region further comprises:

removing the spacer insulating layer; and forming the second junction region on the semiconductor substrate in a space from which the insulating layer spacer is removed, the method further comprising:

patterning the second junction region, the conductive layer, the gate insulating layer, and a portion of the first junction region in a second direction perpendicular to the first direction; and forming the heating material and the data storage material on the second junction region.

50. The method of claim 46, wherein the common junction region extends in the first direction and the second direction.

51. The method of claim 46, wherein the common junction region is formed in the second direction.

52. The method of claim 47, further comprising:
   forming a heating material and a sacrificial layer on the second junction region;
   patterning the sacrificial layer, the heating material, the second junction region, and a portion of the conductive layer to a second direction perpendicular to the first direction;
   removing the sacrificial layer to expose the heating material; and
   forming the data storage material on the exposed heating material.

53. The method of claim 47, wherein the forming a second junction further comprises:
   removing the insulating layer spacer; and
   forming the second junction region on the semiconductor substrate in a space formed by the removal of the insulating layer spacer;
   the method further comprising:
   patterning the second junction region and a portion of the conductive material in a second direction perpendicular to the first direction; and
   forming the heating material and the data storage material on the second junction region.

54. The method of claim 45, wherein the recessing the conductive layer to overlap the channel region further comprises:
   recessing the conductive layer so that a height of the conductive layer is less than or equal to a height of the channel region.

55. The method of claim 52, wherein the data storage material is formed using a variable resistive material.

56. The method of claim 53, wherein the data storage material is formed using a variable resistive material.

57. The method of claim 48, wherein the data storage material is formed using a variable resistive material.

58. The method of claim 49, wherein the data storage material is formed using a variable resistive material.

* * * * *